US012363928B2

(12) United States Patent
Wu et al.

(10) Patent No.: US 12,363,928 B2
(45) Date of Patent: Jul. 15, 2025

(54) SURFACE DAMAGE CONTROL IN DIODES

(71) Applicant: Taiwan Semiconductor Manufacturing Company, Ltd., Hsinchu (TW)

(72) Inventors: Ting-Ying Wu, Tainan (TW); Yung-Hsiang Chen, Tainan (TW); Yu-Lung Yeh, Kaohsiung (TW); Yen-Hsiu Chen, Tainan (TW); Wei-Liang Chen, Tainan (TW); Ying-Tsang Ho, Tainan (TW)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 18/617,795

(22) Filed: Mar. 27, 2024

(65) Prior Publication Data

US 2024/0234589 A1      Jul. 11, 2024

Related U.S. Application Data

(62) Division of application No. 17/530,212, filed on Nov. 18, 2021, now Pat. No. 11,973,148.
(Continued)

(51) Int. Cl.
*H10D 8/60*       (2025.01)
*H10D 8/01*       (2025.01)

(52) U.S. Cl.
CPC .............. *H10D 8/60* (2025.01); *H10D 8/051* (2025.01)

(58) Field of Classification Search
CPC . H01L 29/872; H01L 29/66143; H01L 29/47; H01L 29/0619; H01L 29/0649;
(Continued)

(56) References Cited

U.S. PATENT DOCUMENTS

| 5,639,678 A | 6/1997 | Lee et al. |
| 6,365,511 B1 * | 4/2002 | Kizilyalli .......... H01L 21/76838 |
| | | 257/E21.582 |

(Continued)

FOREIGN PATENT DOCUMENTS

| JP | 2007273931 A | 10/2007 |
| KR | 20150125538 A | 11/2015 |

(Continued)

*Primary Examiner* — Khaja Ahmad
*Assistant Examiner* — Khatib A Rahman
(74) *Attorney, Agent, or Firm* — Sterne, Kessler, Goldstein & Fox P.L.L.C.

(57) ABSTRACT

A semiconductor device and a method of forming the same is disclosed. The semiconductor device includes a substrate, a first well region disposed within the substrate, a second well region disposed adjacent to the first well region and within the substrate, and an array of well regions disposed within the first well region. The first well region includes a first type of dopants, the second well region includes a second type of dopants that is different from the first type of dopants, and the array of well regions include the second type of dopants. The semiconductor device further includes a metal silicide layer disposed on the array of well regions and within the substrate, a metal silicide nitride layer disposed on the metal silicide layer and within the substrate, and a contact structure disposed on the metal silicide nitride layer.

20 Claims, 22 Drawing Sheets

Related U.S. Application Data

(60) Provisional application No. 63/138,078, filed on Jan. 15, 2021.

(58) Field of Classification Search
CPC . H01L 29/423; H01L 29/0607; H01L 29/868; H01L 29/0623; H01L 29/06; H10D 8/60; H10D 8/051; H10D 64/64; H10D 62/102; H10D 62/106; H10D 62/115; H10D 64/27

See application file for complete search history.

(56) References Cited

U.S. PATENT DOCUMENTS

| | | | |
|---|---|---|---|
| 6,885,977 B2 | 4/2005 | Dietl et al. | |
| 7,772,641 B2 | 8/2010 | Omura et al. | |
| 8,274,113 B1* | 9/2012 | Hsieh | H10D 64/256 257/334 |
| 9,887,302 B2 | 2/2018 | Lin et al. | |
| 10,147,815 B2* | 12/2018 | Rubin | H10D 64/259 |
| 10,157,980 B1* | 12/2018 | Lo | H01L 29/0649 |
| 10,229,986 B1* | 3/2019 | Jagannathan | H01L 29/7827 |
| 10,374,040 B1* | 8/2019 | Chanemougame | H01L 21/823431 |
| 10,658,456 B2* | 5/2020 | Lo | H01L 21/2253 |
| 10,985,240 B2 | 4/2021 | Lo et al. | |
| 11,145,720 B2* | 10/2021 | Lee | H01L 29/66439 |
| 11,522,066 B2 | 12/2022 | Chiu et al. | |
| 2010/0059849 A1* | 3/2010 | Quddus | H01L 27/098 438/570 |
| 2010/0291767 A1* | 11/2010 | Miura | H10D 30/0297 438/653 |
| 2011/0284954 A1* | 11/2011 | Hsieh | H10D 30/0295 257/331 |
| 2012/0175724 A1* | 7/2012 | Haynie | H01L 29/872 257/E29.338 |
| 2012/0228717 A1* | 9/2012 | Vellianitis | H10D 8/051 257/E21.632 |
| 2012/0256274 A1* | 10/2012 | Riess | H10D 30/0227 257/E21.409 |
| 2013/0026568 A1* | 1/2013 | Bhalla | H10D 30/0291 257/337 |
| 2014/0332882 A1* | 11/2014 | Lui | H10D 30/668 257/334 |
| 2015/0228808 A1 | 8/2015 | Liao | |
| 2016/0049392 A1* | 2/2016 | Bhalla | H10D 62/127 257/401 |
| 2017/0194451 A1* | 7/2017 | Hua | H10D 30/675 |
| 2018/0090562 A1 | 3/2018 | Lee | |
| 2019/0140045 A1 | 5/2019 | Lo | |
| 2019/0386129 A1* | 12/2019 | Lee | H01L 21/26513 |
| 2020/0083119 A1* | 3/2020 | Koh | H04H 60/04 |
| 2021/0013204 A1* | 1/2021 | Choi | H01L 21/76841 |
| 2022/0231173 A1 | 7/2022 | Wu | |
| 2023/0317828 A1* | 10/2023 | Cheng | H01L 21/76895 257/288 |

FOREIGN PATENT DOCUMENTS

| | | |
|---|---|---|
| KR | 20160123961 A | 10/2016 |
| KR | 20190046656 A | 5/2019 |
| TW | 511295 | 11/2002 |
| TW | 201349513 A | 12/2013 |
| TW | 201807830 A | 3/2018 |

* cited by examiner

⊘ Metal atom
○ Nitrogen atom

SURFACE DAMAGE CONTROL IN DIODES

CROSS-REFERENCE TO RELATED APPLICATIONS

This application is a divisional of U.S. patent application Ser. No. 17/530,212, titled "Surface Damage Control in Diodes," filed Nov. 18, 2021, which claims the benefit of U.S. Provisional Patent Application No. 63/138,078, titled "Semiconductor Device and the Method for Fabricating the Same," filed Jan. 15, 2021, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Figure 1A:
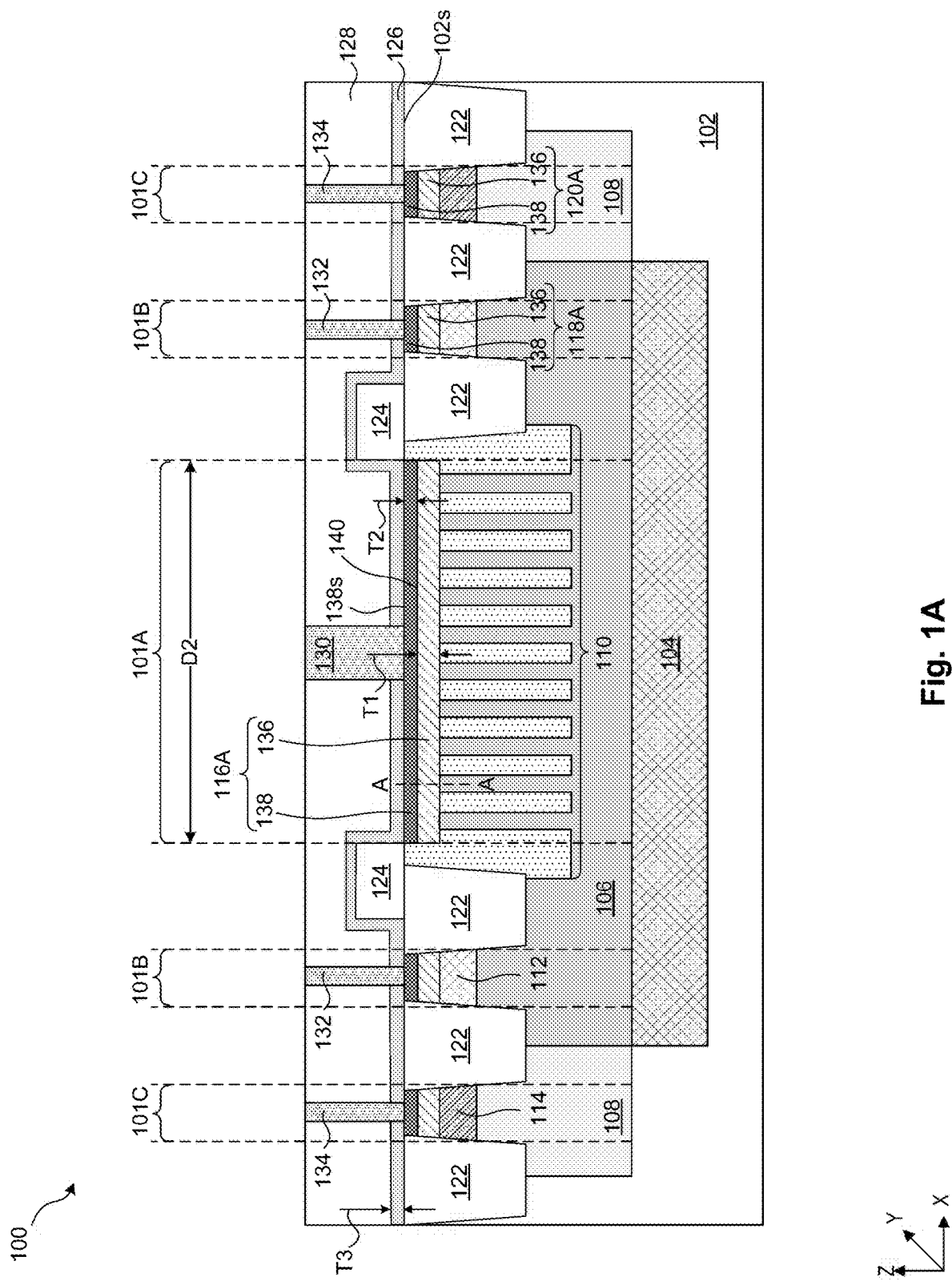
FIGS. 1A-1B illustrates cross-sectional views of a diode, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The present disclosure provides example diodes (e.g., Schottky barrier diodes) and example methods of forming the same. The diode can include a metallic layer disposed on a semiconductor substrate. In some embodiments, the metallic layer can include a stack of metal silicide nitride layer and metal silicide layer. The nitrogen atoms in the metal silicide nitride layer prevent or mitigate the formation of surface traps on the metal silicide nitride layer that cause current leakage in the diode. The surface traps can be due to dangling surface bonds formed during the formation of metallic layer. Surface traps on metallic layer can trap charges and lower the Schottky barrier between metallic layer and the semiconductor material of the substrate. Lowering of the Schottky barrier can result in current leakage during the off state of the diode. In some embodiments, the surface current leakage in the diode with the stack of metal silicide nitride layer and metal silicide layer can be reduced by about 10% to about 50% compared to diodes without the metal silicide nitride layers in the metallic layers. In some embodiments, the diode can include an etch stop layer disposed on the metallic layer and a contact structure disposed on the metallic layer through the etch stop layer.

In some embodiments, the metal silicide layer can be formed by a silicidation process between a metal layer and the semiconductor material of the substrate. In some embodiments, a top portion of the metal silicide layer can be converted to the metal silicide nitride layer during a surface treatment process of the metallic layer performed simultaneously with the silicidation process. The surface treatment process can include introducing nitrogen atoms to the metallic layer through a capping layer disposed on the metallic layer. The capping layer can include a metal nitride material and can prevent the oxidation of the metallic layer during the silicidation process.

In some embodiments, for the adequate diffusion of nitrogen atoms through the capping layer during the surface treatment process, the metal nitride material of the capping layer is formed with a cubic crystal structure. The cubic packing arrangement of the metal atoms and the nitrogen atoms of the capping layer allows nitrogen gas to flow through the capping layer during the surface treatment process. In some embodiments, the formation of the capping layer with the cubic crystal structure can include forming a layer of metal nitride with a metal to nitrogen concentration ratio ranging from about 1:3 to about 1:4. using a gas mixture of argon and nitrogen-based gas. In some embodiments, the ratio of nitrogen to argon in the gas mixture ranges from about 2 to about 4 to form the metal nitride material of the capping layer with a cubic crystal structure. If the metal to nitrogen concentration ratio is outside the range of about 1:3 to about 1:4 and/or if the ratio of nitrogen to argon in the gas mixture is outside the range of about 2 to about 4, the metal atoms and the nitrogen atoms of the capping layer can be formed with other crystal structures, such as hexagonal close-packed (HCP) crystal structure. The HCP packing arrangement of the metal atoms and nitrogen atoms can block the diffusion of nitrogen atoms through the capping layer during the surface treatment process.

Figure 1B:
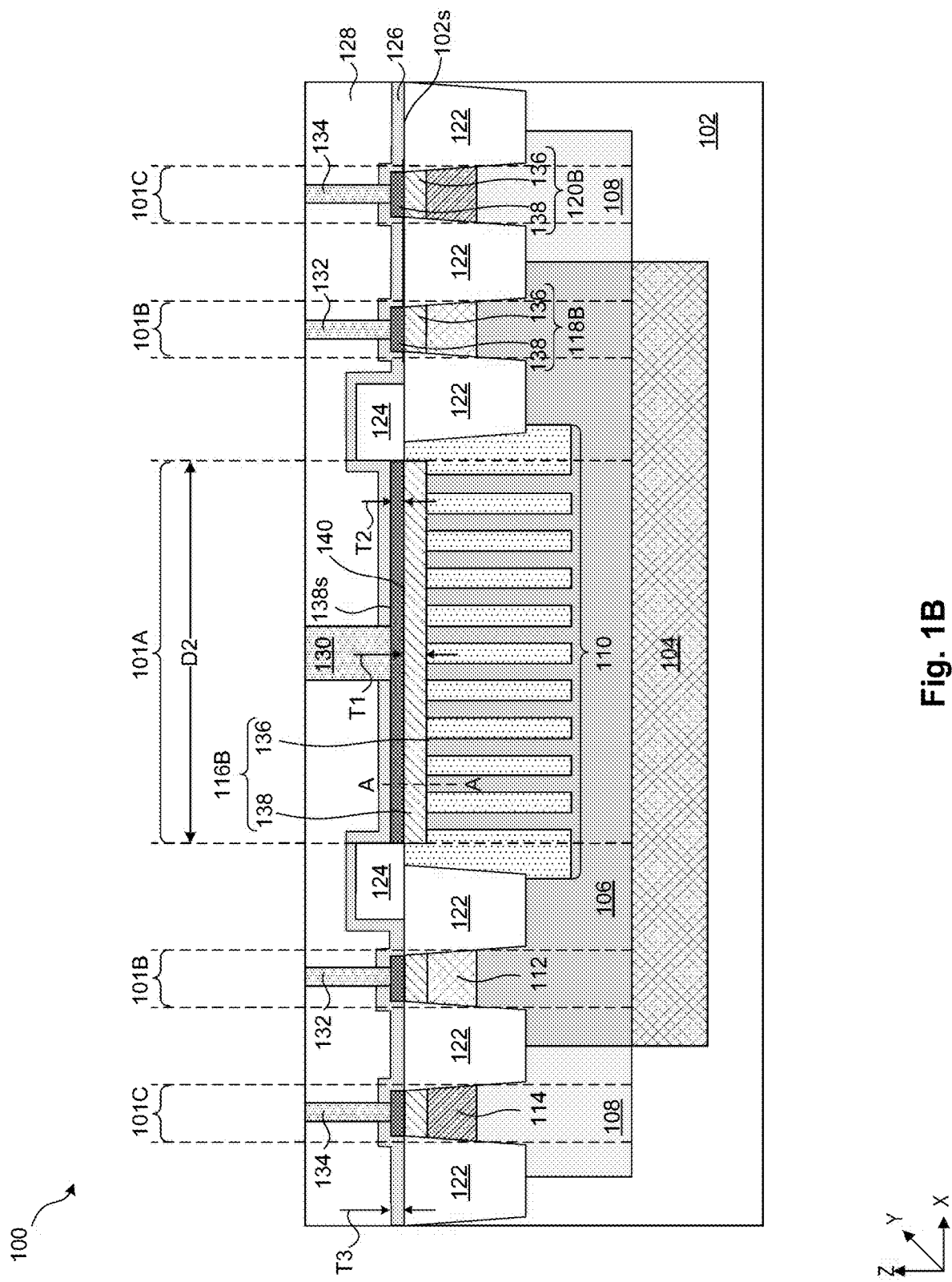

FIGS. 1A and 1B illustrate different cross-sectional views of a diode 100, according to some embodiments. In some embodiments, diode 100 can be a Schottky barrier diode. The discussion of elements in FIGS. 1A-1B with the same annotations applies to each other, unless mentioned otherwise.

Referring to FIGS. 1A-1B, diode 100 can be formed on a substrate 102. There may be other semiconductor devices, such as FETs and/or other diodes formed on substrate 102. Substrate 102 can be a semiconductor material, such as silicon, germanium (Ge), silicon germanium (SiGe), gallium arsenide (GaAs), a silicon-on-insulator (SOI) structure, other suitable semiconductor materials, and a combination thereof. In some embodiments, substrate 102 can include an epitaxial semiconductor layer, a gradient semiconductor layer, or a semiconductor layer on another semiconductor layer of a different type, such as a silicon layer on a silicon germanium layer. In some embodiments, substrate 102 can be doped with p-type dopants (e.g., boron, indium, aluminum, or gallium) or n-type dopants (e.g., phosphorus or arsenic).

In some embodiments, diode 100 can include (i) a first well region 104, (ii) a second well region 106, (iii) a third well region 108, (iv) a fourth well region 110, (v) first doped regions 112, (vi) second doped regions 114, (vii) metallic layers 116A, 118A, and 120A, (viii) shallow trench isolation (STI) regions 122, (ix) dielectric layers 124, (x) an etch stop layer (ESL) 126, (xi) an interlayer dielectric (ILD) layer 128, and (xii) contact structures 130, 132, and 134.

The elements and/or portions of the elements of diode 100 within region 101A can form an anode region 101A, regions 101B can form cathode regions 101B, and regions 101C can form bulk regions 101C. In some embodiments, anode region 101A can include fourth well region 110, metal layer 116A, contact structure 130, and portions of second well region 106, ESL 126, and ILD layer 128 within region 101A.

In some embodiments, cathode regions 101B can include first doped regions 112, metal layers 118A, contact structures 132, and portions of second well region 106, ESL 126, and ILD layer 128 within region 101B. In some embodiments, bulk regions 101C can include second doped regions 114, metal layers 120A, contact structures 134, and portions of third well region 108, ESL 126, and ILD layer 128 within region 101C. diode 100 can be configured to have electric current flow from anode region 101A to cathode regions 101B during operation and to electrically connect bulk regions 101C to substrate 102.

First well region 104 can be a deep well region disposed within substrate 102. In some embodiments, first well region 104 can be doped with a type of dopant (i.e., n- or p-type) that is different from the type of dopant in substrate 102. In some embodiments, first well region 104 can be doped with n-type dopants, such as phosphorus, arsenic, antimony, bismuth, selenium, tellurium, and other suitable n-type dopants with a doping concentration ranging from about $1\times10^{15}$ atoms/cm$^3$ to about $1\times10^{17}$ atoms/cm$^3$. In some embodiments, first well region 104 can be about 4 μm to about 6 μm below ESL 126 and can have a thickness ranging from about 0.5 μm to about 4 μm.

Second well region 106 can be disposed on first well region 104 and within substrate 102. In some embodiments, dimensions (e.g., widths) of first and second well regions 104 and 106 along an X-axis can be substantially equal to each other. In some embodiments, second well region 106 can be doped with a type of dopant (i.e., n- or p-type) that is the same as the type of dopant in first well region 104, but with a doping concentration that is less than the doping concentration of first well region 104. In some embodiments, second well region 106 can be doped with n-type dopants, such as phosphorus, arsenic, antimony, bismuth, selenium, tellurium, and other suitable n-type dopants with a doping concentration ranging from about $1\times10^{13}$ atoms/cm$^3$ to about $1\times10^{16}$ atoms/cm$^3$.

Third well region 108 can be disposed within substrate 102 and adjacent to and/or laterally surrounding second well region 106. In some embodiments, third well region 108 can be doped with a type of dopant (i.e., n- or p-type) that is different from the type of dopant in second well region 106, and with a doping concentration that is greater than the doping concentration of second well region 106 and substrate 102. In some embodiments, third well region 108 can be doped with p-type dopants, such as boron, indium, aluminum, gallium, and other suitable p-type dopants with a doping concentration ranging from about $1\times10^{15}$ atoms/cm$^3$ to about $1\times10^{18}$ atoms/cm$^3$.

In some embodiments, fourth well region 110 can include an array of well regions disposed within second well region 106, as shown in FIG. 1A. The array of well regions can include greater than five and less than fifteen well regions for diode 100 to adequately function without compromising device size and manufacturing cost. In some embodiments, fourth well region 110 can be doped with a type of dopant (i.e., n- or p-type) that is different from the type of dopant in second well region 106, and with a doping concentration that is greater than the doping concentration of second well region 106 and substrate 102. In some embodiments, fourth well region 110 can be doped with p-type dopants, such as boron, indium, aluminum, gallium, and other suitable p-type dopants with a doping concentration ranging from about $1\times10^{15}$ atoms/cm$^3$ to about $1\times10^{18}$ atoms/cm$^3$. In some embodiments, the dimensions (e.g., heights) of fourth well region 110 along a Z-axis can greater than that of STI regions 122.

First doped regions 112 can be disposed within second well region 106. In some embodiments, first doped regions 112 can be doped with a type of dopant (i.e., n- or p-type) that is different from the type of dopant in fourth well region 110, and with a doping concentration that is substantially equal to or greater than the doping concentration of fourth well region 110. In some embodiments, first doped regions 112 can be doped with n-type dopants, such as phosphorus, arsenic, antimony, bismuth, selenium, tellurium, and other suitable n-type dopants with a doping concentration ranging from about $1 \times 10^{17}$ atoms/cm$^3$ to about $1 \times 10^{21}$ atoms/cm$^3$. In some embodiments, first doped regions 112 can act as the cathodes of diode 100 and can conductively couple cathode regions 101B to a cathode terminal (not shown). The doping concentration of first doped regions 112 can be used to control electrical properties of cathode regions 101B.

Second doped regions 114 can be disposed within third well region 108. In some embodiments, second doped regions 114 can form a continuous region surrounding cathode regions 101B. In some embodiments, second doped regions 114 can be doped with a type of dopant (i.e., n- or p-type) that is different from the type of dopant in first doped regions 112, and with a doping concentration that is substantially equal to or greater than the doping concentration of first doped regions 112. In some embodiments, second doped regions 114 can be doped with p-type dopants, such as boron, indium, aluminum, gallium, and other suitable p-type dopants with a doping concentration ranging from about $1 \times 10^{17}$ atoms/cm$^3$ to about $1 \times 10^{21}$ atoms/cm$^3$. In some embodiments, second doped regions 114 can conductively couple bulk regions 101C to a body terminal (not shown). The doping concentration of second doped regions 114 can be used to control electrical properties of bulk regions 101C.

Referring to FIG. 1A, in some embodiments, metallic layer 116A can include (i) a metal silicide layer 136 disposed on second well region 106 and fourth well region 110, and (ii) a metal silicide nitride layer 138 disposed on metal silicide layer 136. In some embodiments, both metal silicide layer 136 and metal silicide nitride layer 138 can be disposed within substrate 102. In some embodiments, a top surface 138s of metal silicide nitride layer 138 can be substantially coplanar with a top surface 102s of substrate 102. In some embodiments, an interface 140 between metal silicide layer 136 and metal silicide nitride layer 138 can be disposed within substrate 102 and at a plane lower than top surface 142 of substrate 102.

Referring to FIG. 1B, in some embodiments, diode 100 can have a metallic layer 116B with metal silicide layer 136 disposed within substrate 102 and metal silicide nitride layer 138 disposed on top surface 102s of substrate 102. Interface 140 between metal silicide layer 136 and metal silicide nitride layer 138 can be substantially coplanar with top surface 102s of substrate 102, or can be disposed at a plane higher than top surface 102s of substrate 102 (not shown). The relative position of metallic layers 116A and 116B with respect to top surface 102s of substrate 102 can depend on the fabrication process of diode 100, as described in detail below.

Referring to FIGS. 1A and 1B, Schottky junctions can be formed at the interfaces between metal silicide layer 136 and second well region 106 and between metal silicide layer 136 and fourth well region 110. In some embodiments, metal silicide layer 136 can include cobalt silicide ($Co_xSi_y$), titanium silicide ($Ti_xSi_y$), nickel silicide ($Ni_xSi_y$), tantalum silicide ($Ta_xSi_y$), molybdenum ($Mo_xSi_y$), platinum silicide ($Pt_xSi_y$), zirconium silicide ($Zr_xSi_y$), tungsten silicide ($W_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), manganese silicide ($Mn_xSi_y$), iron silicide ($Fe_xSi_y$), rhodium silicide ($Rh_xSi_y$), palladium silicide ($Pd_xSi_y$), ruthenium silicide ($Ru_xSi_y$), iridium silicide ($Ir_xSi_y$), osmium silicide ($Os_xSi_y$), other suitable metal silicide materials, or a combination thereof. In some embodiments, metal silicide layer 136 can include $Co_xSi_y$, $Ti_xSi_y$, or $Ni_xSi_y$, where the value of x is equal to 1 and the value of y is equal to 1.

In some embodiments, metal silicide nitride layer 138 can include cobalt silicide nitride ($Co_xSi_yN_z$), titanium silicide nitride ($Ti_xSi_yN_z$), nickel silicide nitride ($Ni_xSi_yN_z$), tantalum silicide nitride ($Ta_xSi_yN_z$), molybdenum nitride ($Mo_xSi_yN_z$), platinum silicide nitride ($Pt_xSi_yN_z$), zirconium silicide nitride ($Zr_xSi_yN_z$), tungsten silicide nitride ($W_xSi_yN_z$), scandium silicide nitride ($Sc_xSi_yN_z$), yttrium silicide nitride ($Y_xSi_yN_z$), terbium silicide nitride ($Tb_xSi_yN_z$), lutetium silicide nitride ($Lu_xSi_yN_z$), erbium silicide nitride ($Er_xSi_yN_z$), ybtterbium silicide nitride ($Yb_xSi_yN_z$), curopium silicide nitride ($Eu_xSi_yN_z$), thorium silicide nitride ($Th_xSi_yN_z$), manganese silicide nitride ($Mn_xSi_yN_z$), iron silicide nitride ($Fe_xSi_yN_z$), rhodium silicide nitride ($Rh_xSi_yN_z$), palladium silicide nitride ($Pd_xSi_yN_z$), ruthenium silicide nitride ($Ru_xSi_yN_z$), iridium silicide nitride ($Ir_xSi_yN_z$), osmium silicide nitride ($Os_xSi_yN_z$), other suitable metal silicide nitride materials, or a combination thereof, where the value of z is ranges from about 1 to about 2. In some embodiments, metal silicide nitride layer 138 can include $Co_xSi_yN_z$, $Ti_xSi_yN_z$, or $Ni_xSi_yN_z$, where the value of x is equal to 1, the value of y is equal to 1, and the value of z ranges from about 1 to about 2.

The nitrogen atoms in metal silicide nitride layer 138 prevent or mitigate the formation of surface traps on top surface 138s of metal silicide layer 138 and at interface 140 between metal silicide layer 136 and metal silicide nitride layer 138. The surface traps can be due to dangling surface bonds formed during the formation of metallic layer 116A. Surface traps on metallic layer 116A and/or at interface 140 can trap charges and lower the Schottky barrier between metallic layer 116A and the semiconductor material (e.g., silicon) of second well region 106 and fourth well region 110. Lowering of the Schottky barrier can result in current leakage during the off state of diode 100. With the use of metal silicide nitride layer 138 on metal silicide layer 136, current leakage in diode 100 can be reduced by about 10% to about 50% compared to diodes without metal silicide nitride layer 136. Thus, the device performance of diode 100 can be improved with the use of metal silicide nitride layer 138 in metallic layers 116A and 116B.

Figure 1C:
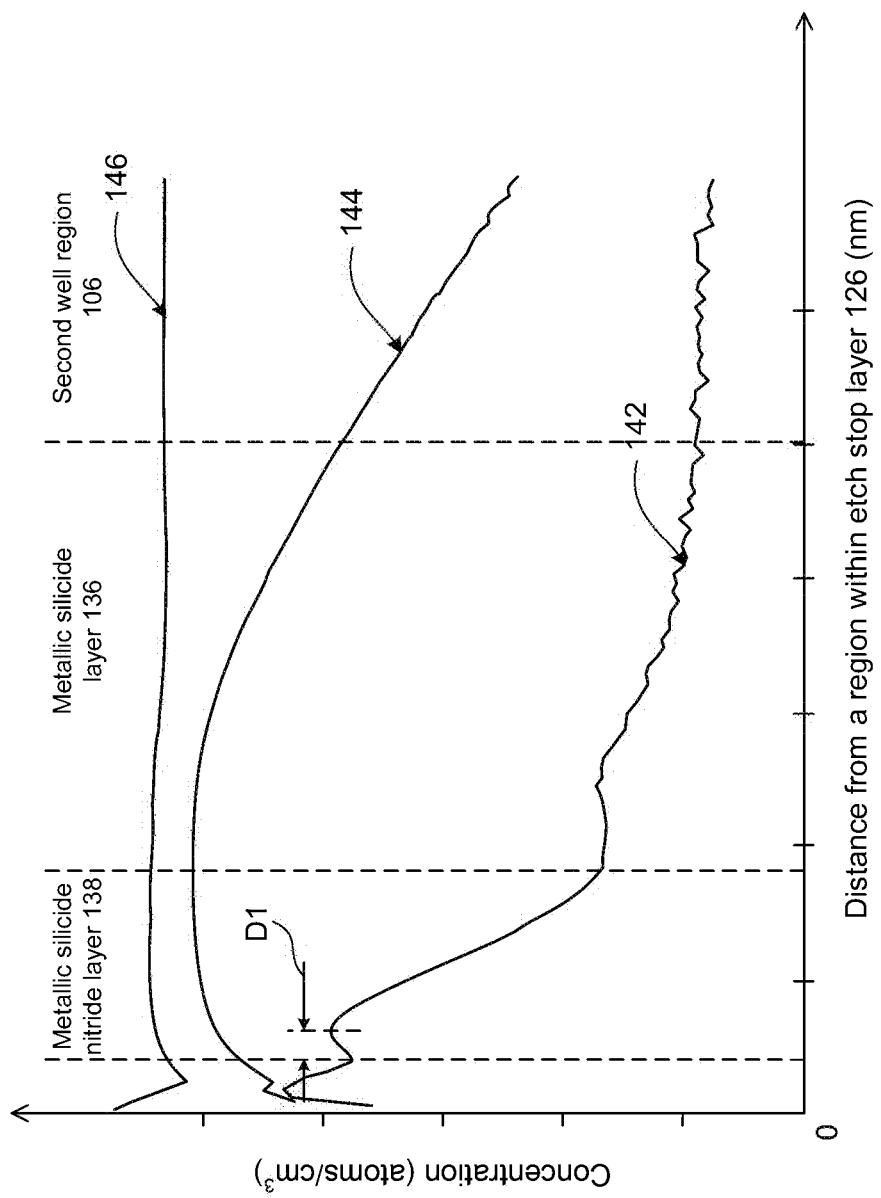
FIG. 1C illustrates device characteristics of a diode, in accordance with some embodiments.

FIG. 1C shows the nitrogen, metal, and silicon concentration profiles 142, 144, and 146 across ESL 126, metal silicide nitride layer 138, metal silicide layer 136, and second well region 106 along line A-A of FIGS. 1A and 1B, according to some embodiments. As shown in FIG. 1C, the peak concentration of nitrogen atoms (profile 142) is close to top surface 138s of metal silicide nitride layer 138. In some embodiments, for adequate reduction in current leakage in diode 100, the peak concentration of nitrogen atoms is a distance D1 away from top surface 138s of metal silicide nitride layer 138. In some embodiments, distance D1 can range from about 0.05 nm to about 1 nm. If distance D1 is greater than 1 nm, the resistivity and/or current leakage of diode 100 increases, and as a result, degrades the device performance.

Referring to FIGS. 1A-1B, in some embodiments, for adequate device performance of diode 100 with minimal current leakage, metal silicide layer 136 can have a thickness T1 ranging from about 20 nm to about 40 nm and metal silicide nitride layer 138 can have a thickness T2 less than 9 nm (e.g., from about 0.1 nm to about 8.9 nm). In some embodiments, a ratio between thickness T2 and thickness T1 (i.e., T2:T1) can range from about 1:3 to about 1:20.

The discussion of metallic layers 116A and 116B applies to (i) metallic layers 118A and 118B disposed on first doped regions 112, and (ii) metallic layers 120A and 120B disposed on second doped regions 114, unless mentioned otherwise.

STI regions 122 can be configured to electrically isolate anode region 101A from cathode regions 101B and electrically isolate cathode regions 101B from bulk regions 101C. In some embodiments, STI regions 122 can include an insulating material, such as silicon oxide ($SiO_x$), silicon nitride (SiN), silicon oxynitride (SiON), silicon oxycarbide (SiOC), silicon carbonitride (SiCN), other suitable insulating materials, and a combination thereof. In some embodiments, STI regions 122 can be disposed within substrate 102 and top surface of STI regions 122 can be substantially coplanar with top surface 102s of substrate 102. In some embodiments, the top surface of STI regions 122 can be substantially coplanar with top surface 138s of metal silicide layer 138, as shown in FIG. 1A, or can be substantially coplanar with interface 140, as shown in FIG. 1B. In some embodiments, interface 140 can be at a plane higher than the top surface of STI regions 122 (not shown). In some embodiments, the dimensions (e.g., heights) of STI regions 122 along a Z-axis can be smaller than the dimensions (e.g., heights) of fourth well region 110 along a Z-axis. In some embodiments, the dimensions (e.g., heights) of STI regions 122 along a Z-axis can be greater than the dimensions (e.g., heights) of first doped regions 112 and second doped regions 114 along a Z-axis.

In some embodiments, dielectric layers 124 can include oxide layers and can be configured to control the resistivity of diode 100. The resistivity can be controlled by adjusting the dimensions (e.g., lengths) of dielectric layers 124 along an X-axis. Extending the dimensions (e.g., lengths) of dielectric layer 124 along an X-axis to reduce distance D2 between dielectric layers 124 can increase the resistivity of diode 100. In addition, adjusting distance D2 between dielectric layers 124 can control the dimensions of metallic layers 116A and 116B along an X-axis, and as a result control the resistivity of diode 100.

In some embodiments, ESL 126 can include an insulating material, such as silicon oxide ($SiO_x$), silicon nitride (SiN), silicon oxynitride (SiON), silicon oxycarbide (SiOC), silicon carbonitride (SiCN), other suitable insulating materials, and a combination thereof. ESL 126 protects underlying layers from subsequent processing of ILD layer 128 and/or contact structures 130, 132, and 134 of diode 100 and/or from subsequent processing of other structures (e.g., interconnect structures) on diode 100 and/or on substrate 102. In some embodiments, ESL 126 can have a thickness T3 ranging from about 5 nm to about 10 nm for adequate protection of underlying layers without compromising device size and manufacturing cost. In some embodiments, a ratio between thickness T2 of metal silicide nitride layer 138 and thickness T3 of ESL 126 (i.e., T2:T3) can range from about 1:20 to about 1:40.

In some embodiments, ILD layer 128 can include an insulating material, such as silicon oxide ($SiO_x$), silicon nitride (SiN), silicon oxynitride (SiON), silicon oxycarbide (SiOC), silicon carbonitride (SiCN), other suitable insulating materials, and a combination thereof. Contact structures 130, 132, and 134 can be disposed on metal silicide nitride layers 138 through ILD layer 128 and ESL 126. Each of contact structures 130, 132, and 134 can include a conductive material with low resistivity (e.g., resistivity of about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. In some embodiments, the dimension (e.g., width) of contact structures 130 along an X-axis can be greater than the dimension (e.g., widths) of contact structures 132, and 134 along an X-axis.

Figure 2:
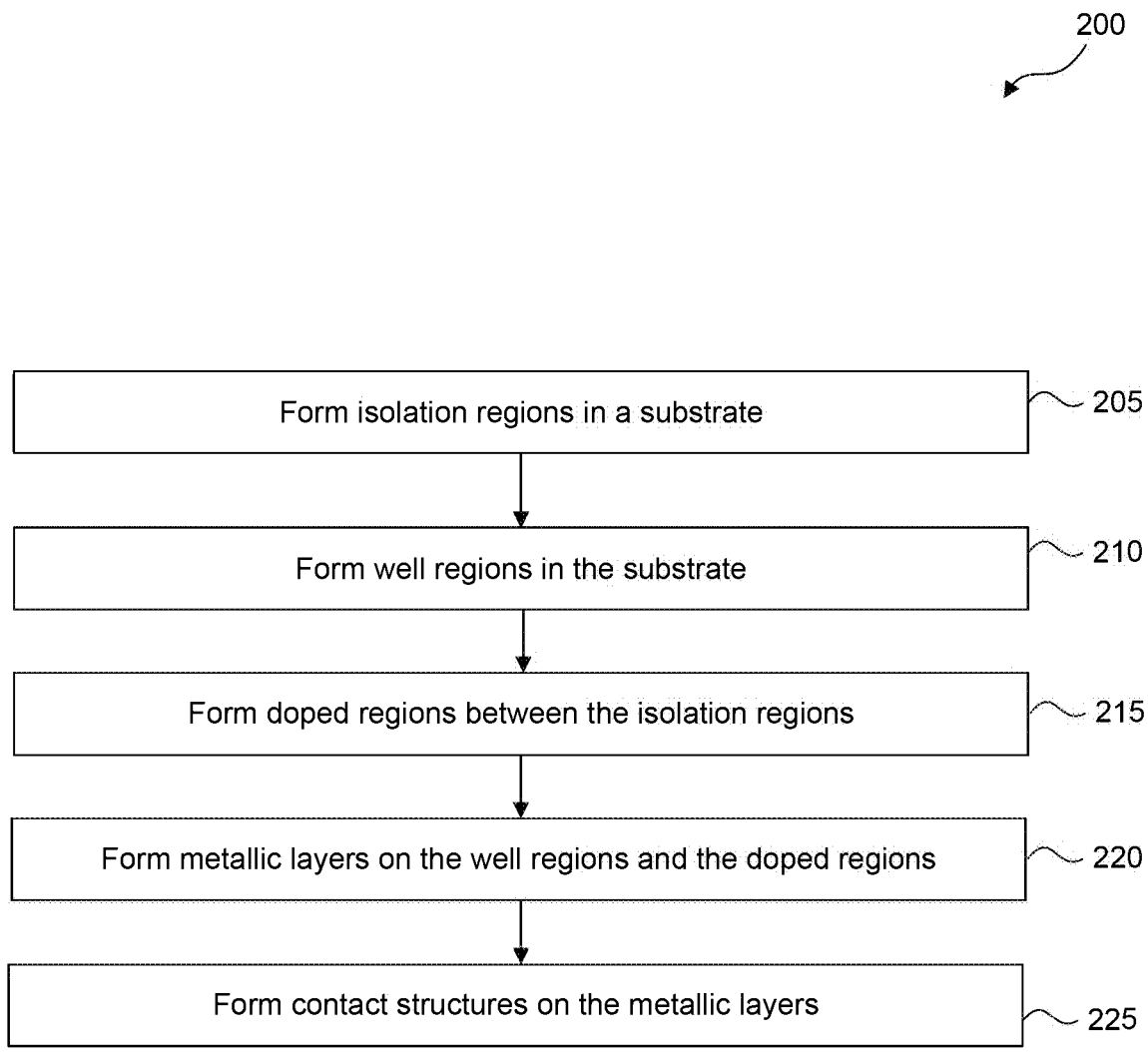
FIG. 2 is a flow diagram of a method for fabricating a diode, in accordance with some embodiments.
Figure 19:
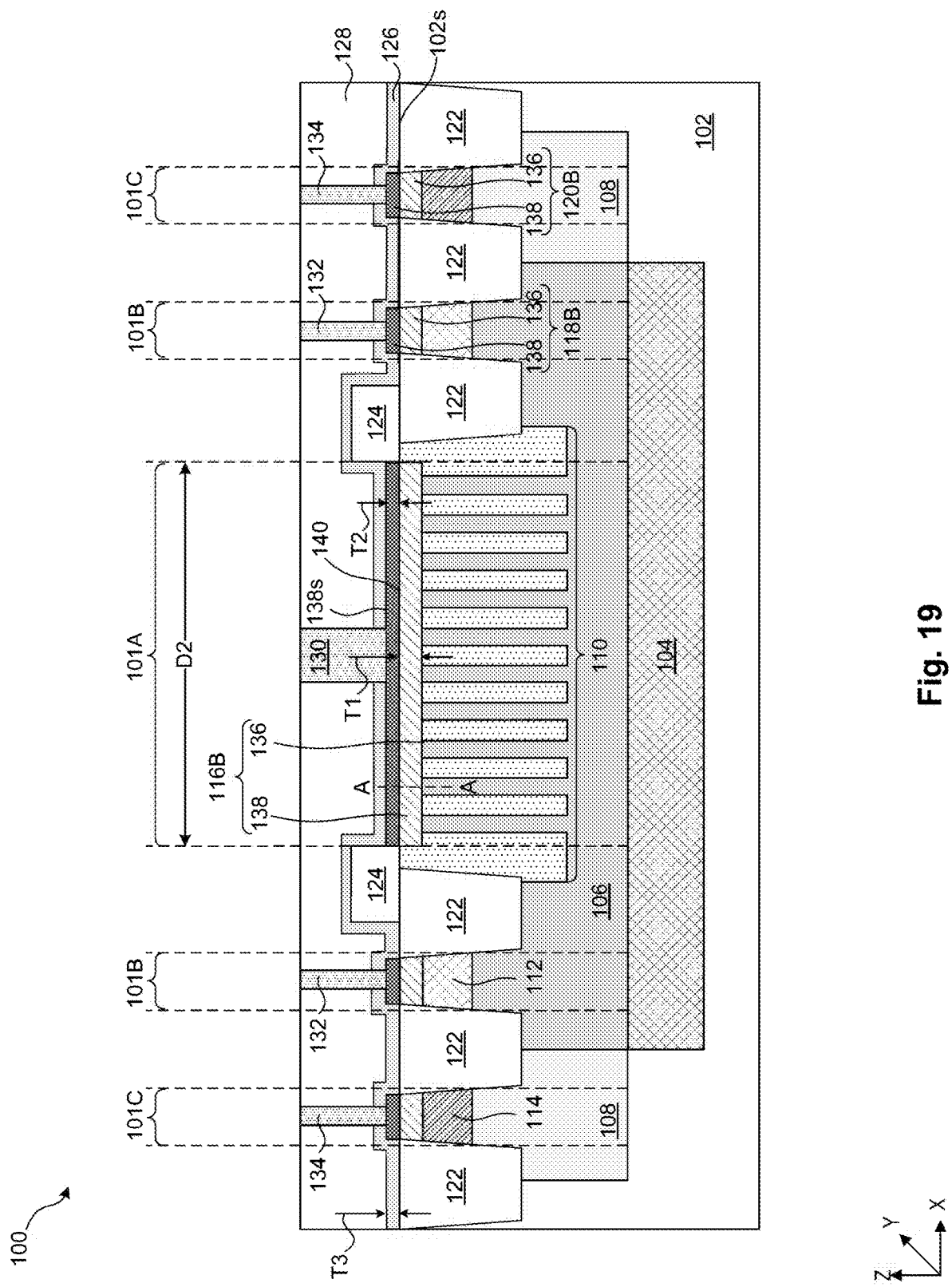
Figure 21:
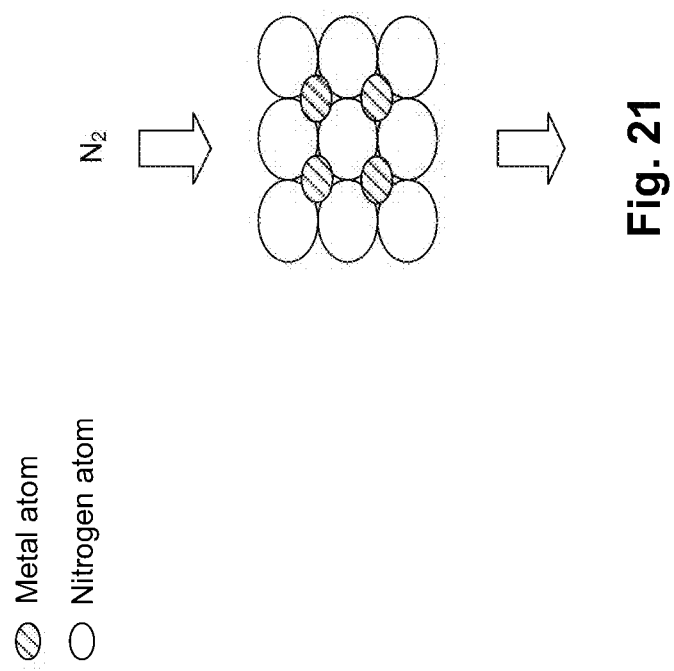
FIGS. 20-21 illustrate crystal structures of a capping layer used in the fabrication of a diode, in accordance with some embodiments.
Figure 20:
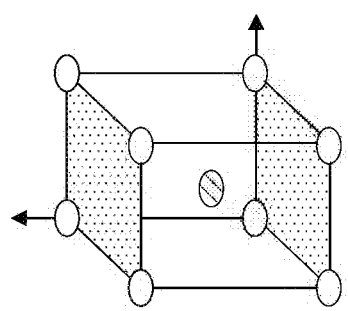

FIG. 2 is a flow diagram of an example method 200 for fabricating diode 100 with cross-sectional views shown in FIGS. 1A and 1B, according to some embodiments. For illustrative purposes, the operations illustrated in FIG. 2 will be described with reference to the example fabrication process for fabricating diode 100 as illustrated in FIGS. 3-21. FIGS. 3-19 are cross-sectional views of diode 100 at various stages of fabrication, according to some embodiments. FIGS. 20-21 illustrate crystal structures of a capping layer used in the fabrication of a diode 100, according to some embodiments. Operations can be performed in a different order or not performed depending on specific applications. It should be noted that method 200 may not produce a complete diode 100. Accordingly, it is understood that additional processes can be provided before, during, and after method 200, and that some other processes may only be briefly described herein. Elements in FIGS. 3-21 with the same annotations as elements in FIGS. 1A-1B are described above.

Figure 3:
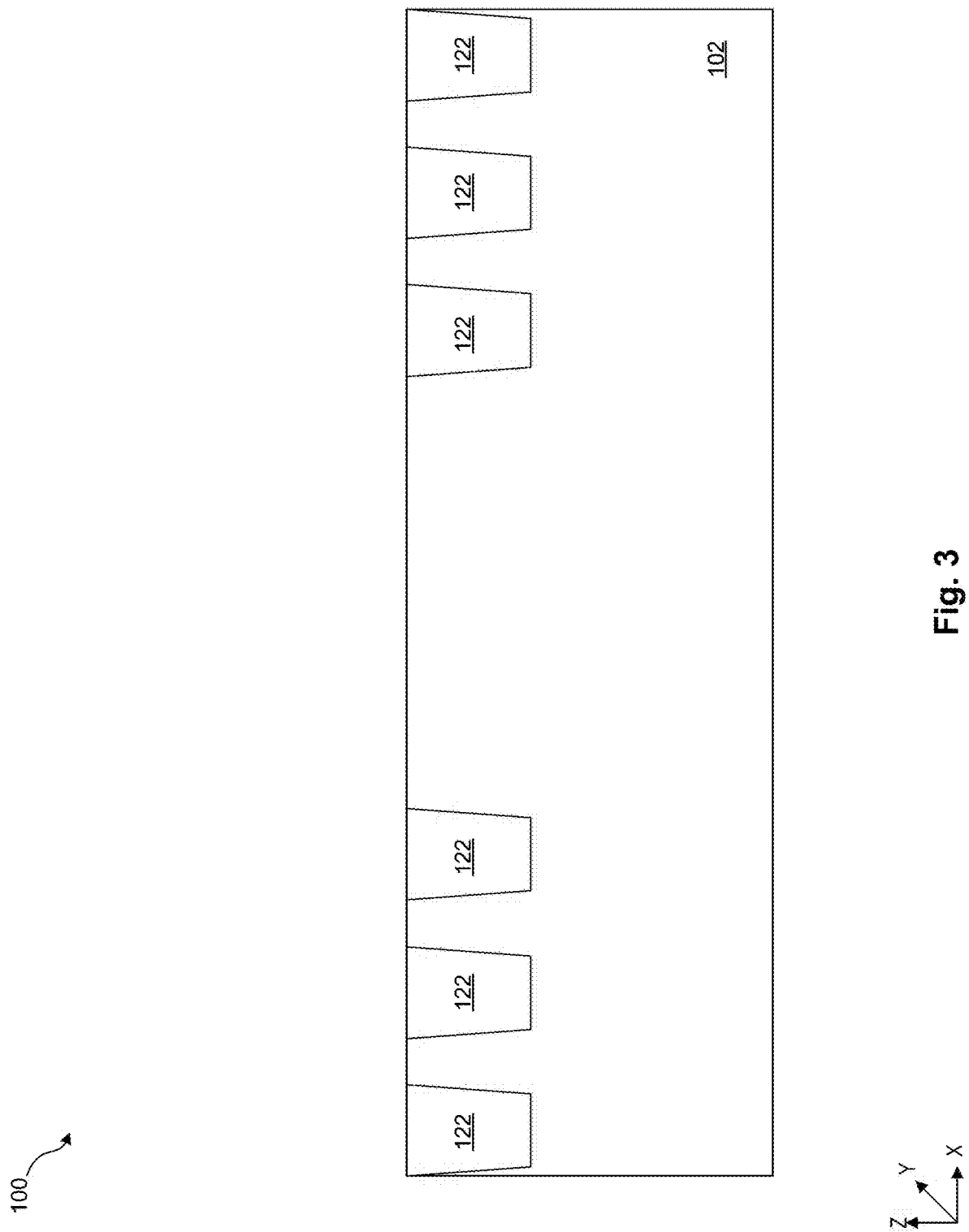
FIGS. 3-19 illustrate cross-sectional views of a diode at various stages of its fabrication process, in accordance with some embodiments.

In operation 205, isolation regions are formed in a substrate. For example, as shown in FIG. 3, STI regions 122 are formed in substrate 102. The formation of STI regions 122 can include sequential operations of (i) forming trenches (not shown) in substrate 102, (ii) depositing a layer of insulating material within the trenches to fill the trenches (not shown), and (iii) performing a chemical mechanical polishing (CMP) process on the layer of insulating material to form the structure of FIG. 3.

Figure 4:
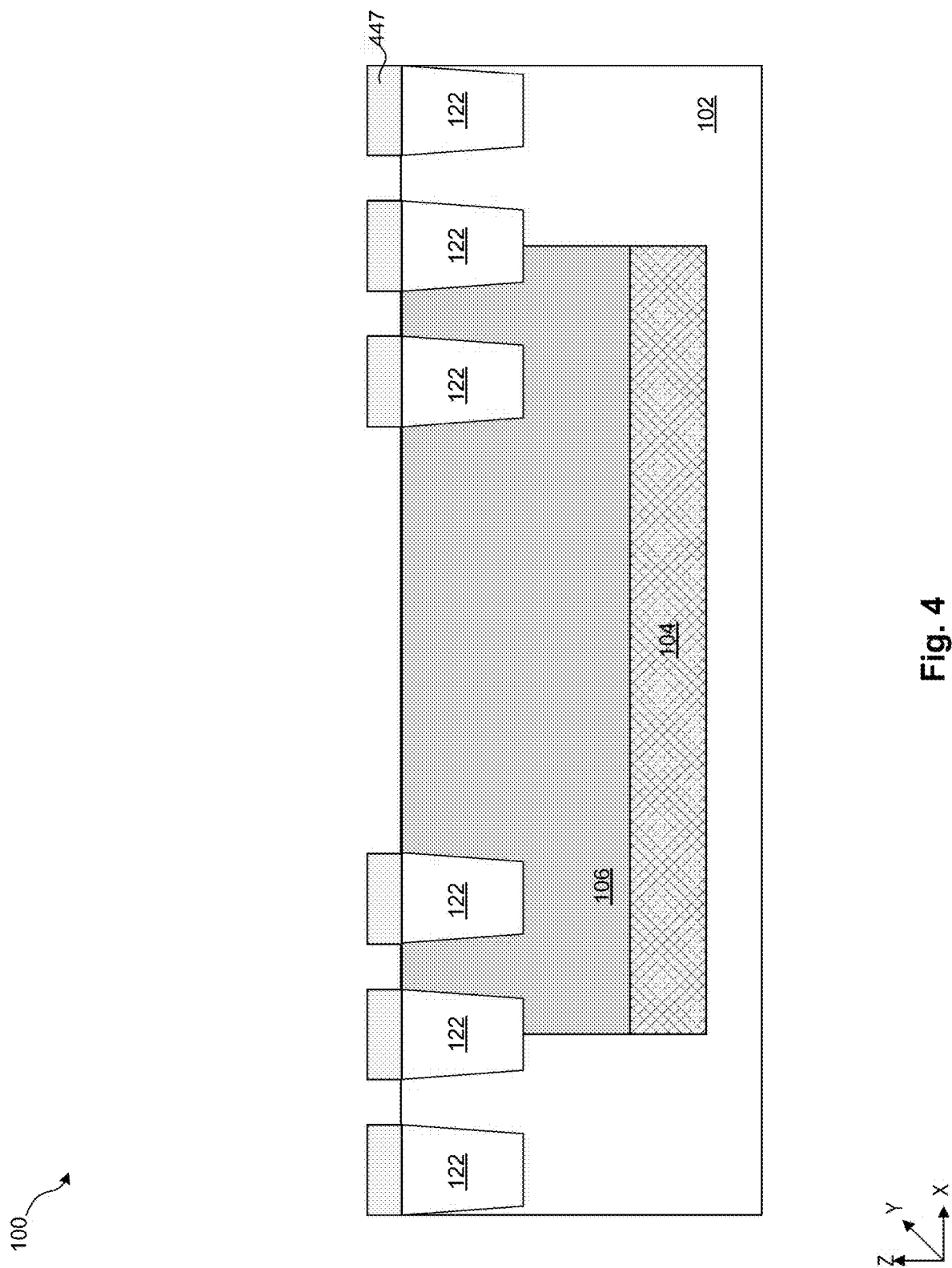
Figure 5:
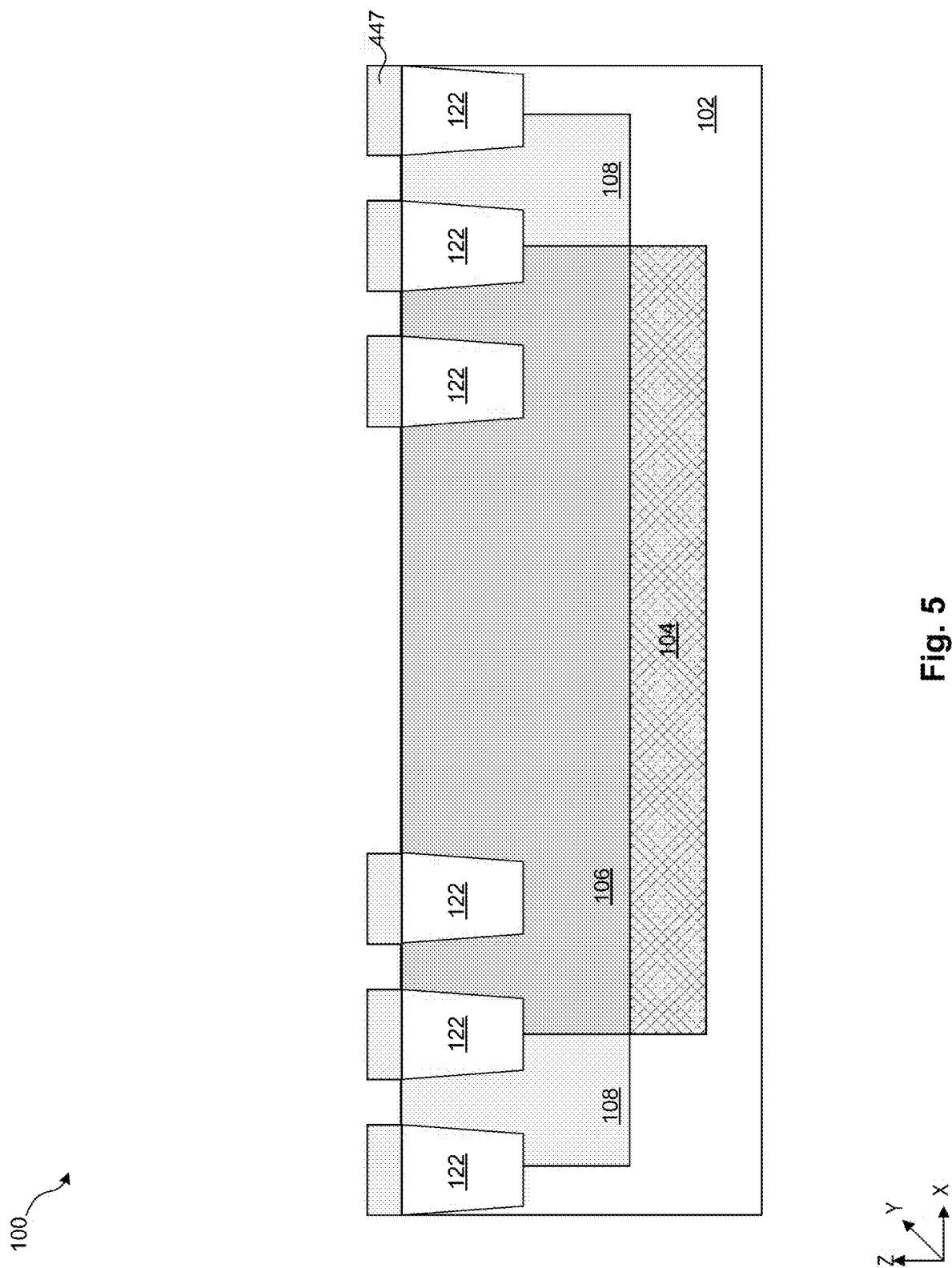
Figure 6:
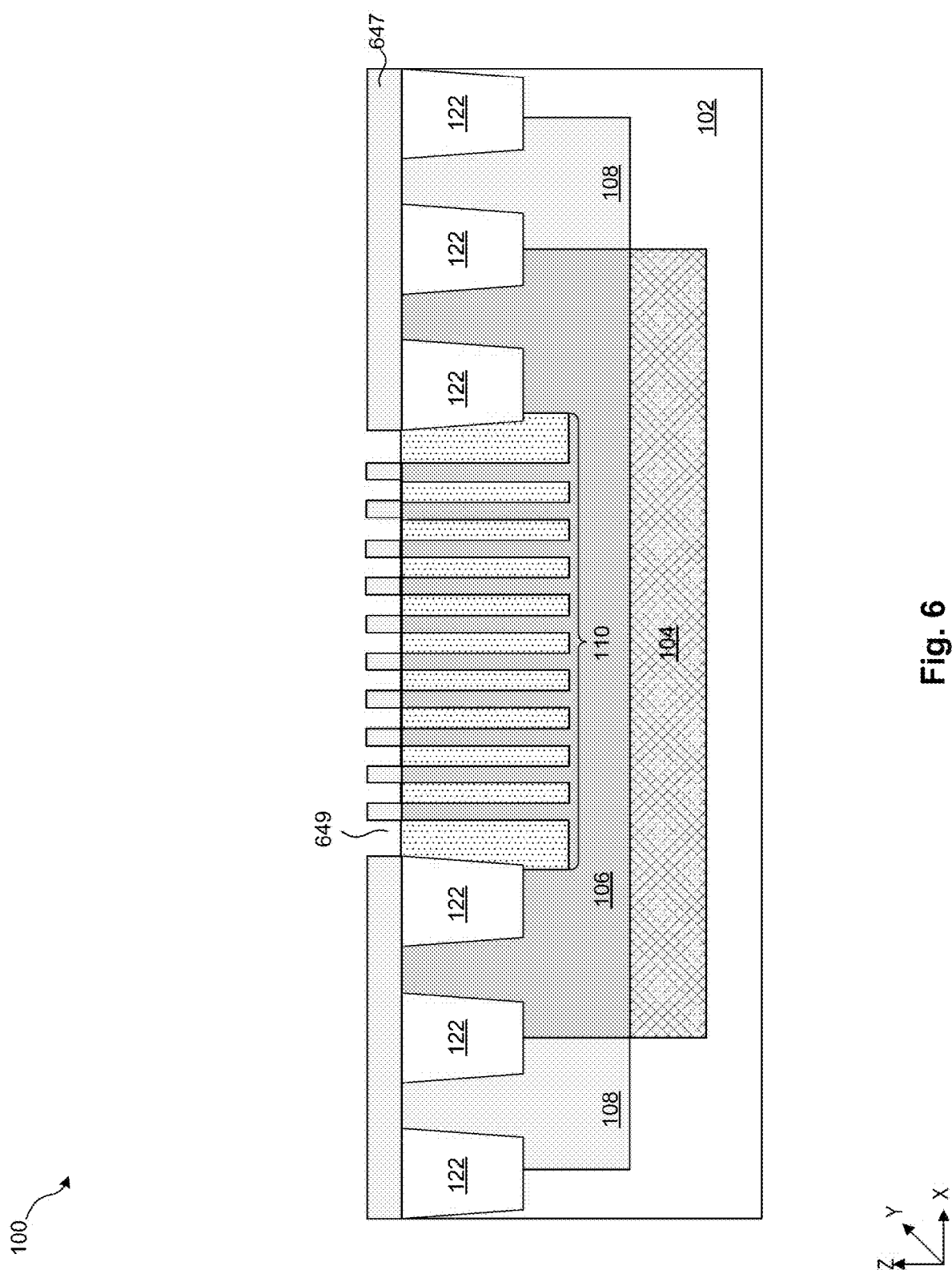

Referring to FIG. 2, in operation 210, well regions are formed in the substrate. For example, as described with reference to FIGS. 4-6, first well region 104, second well region 106, third well region 108, and fourth well region 110 are formed in substrate 102. The formation of well regions can include sequential operations of (i) forming a patterned masking layer 447 on STI regions 122, as shown in FIG. 4, (ii) implanting n-type dopants within substrate 102 to form first well region 104, as shown in FIG. 4, (iii) implanting n-type dopants on substrate region over first well region 104 to form the structure of FIG. 4, (iv) implanting p-type dopants within substrate regions adjacent to second well region 106 to form the structure of FIG. 5, (v) removing patterned masking layer 447 from the structure of FIG. 5 (not shown), (vi) forming a patterned masking layer 647, as shown in FIG. 6, (vii) implanting p-type dopants through openings 649 to form the structure of FIG. 6, and (viii) removing patterned masking layer 647.

Figure 7:
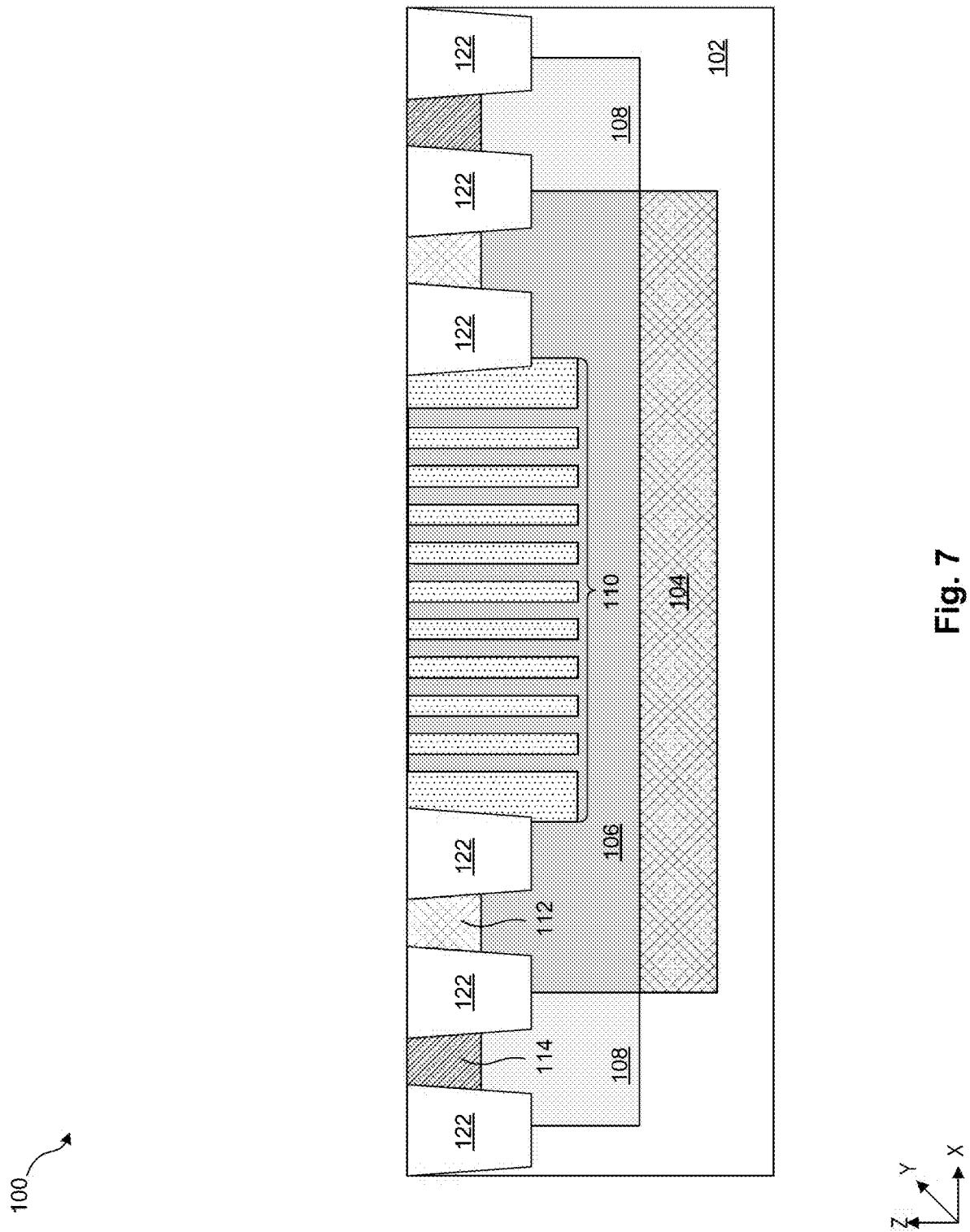

Referring to FIG. 2, in operation 215, doped regions are formed between the isolation regions. For example, as shown in FIG. 7, first doped regions 112 and second doped regions 114 are formed between STI regions 122. First doped regions 112 can be formed by implanting n-type dopants within second well region between STI regions 122, as shown in FIG. 7. Second doped regions 114 can be formed by implanting p-type dopants within third well regions 108, as shown in FIG. 7. After the formation of second doped regions 114, dielectric layers 124 can be patterned on the structure of FIG. 7 to form the structure of FIG. 8.

Referring to FIG. 2, in operation 220, metallic layers are formed on the well regions and the doped regions. For example, as described with reference to FIGS. 9-17, metallic layers 116A and 116B are formed on second well region 106 and fourth well region 110, metallic layers 118A and 118B are formed on first doped regions 112, and metallic layers 120A and 120B are formed on second doped regions 114. Metallic layers 116A, 118A, and 120A can be formed at the same time and metallic layers 116B, 118B, and 120B can be formed at the same time, as described below.

Figure 8:
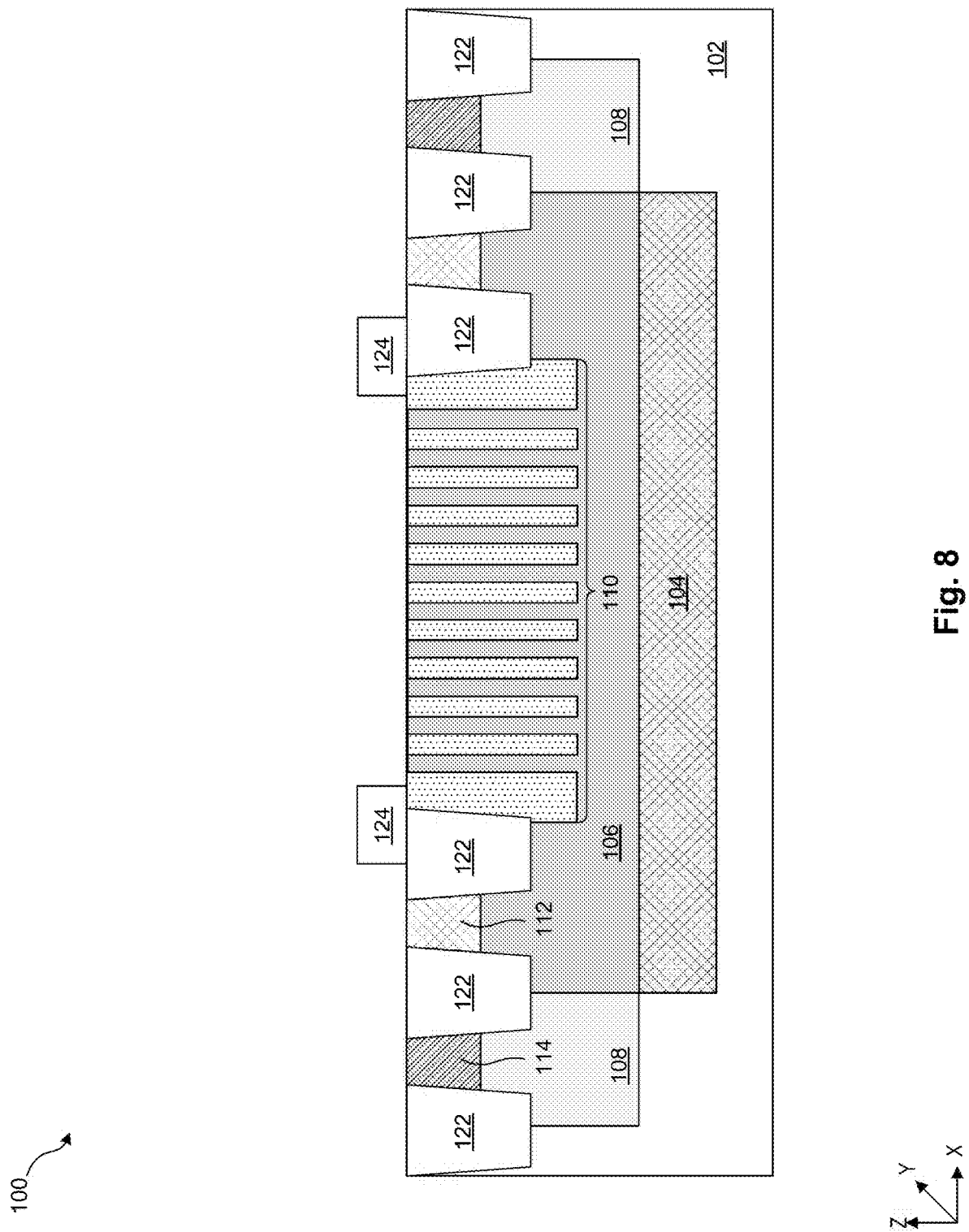
Figure 9:
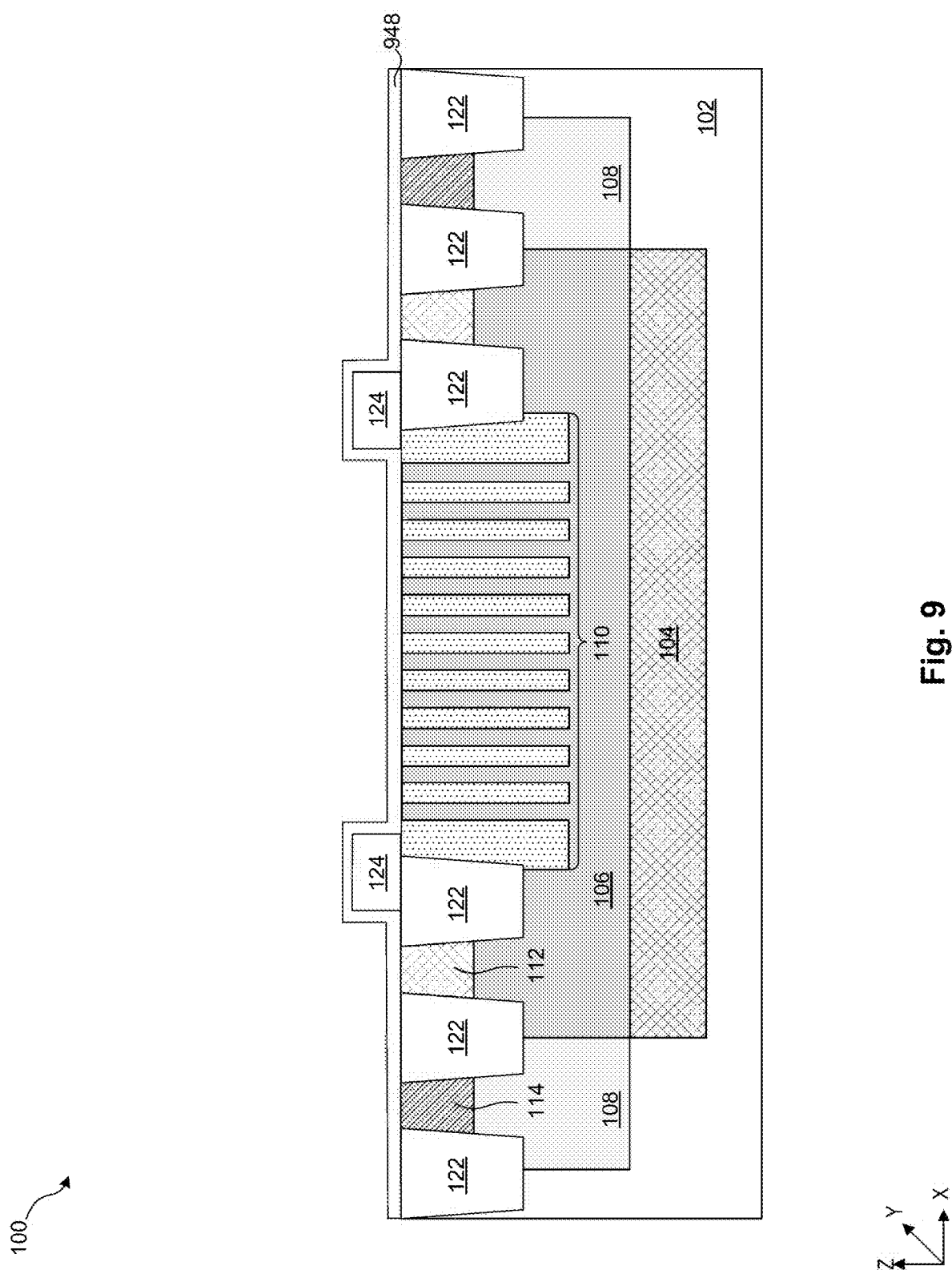
Figure 10:
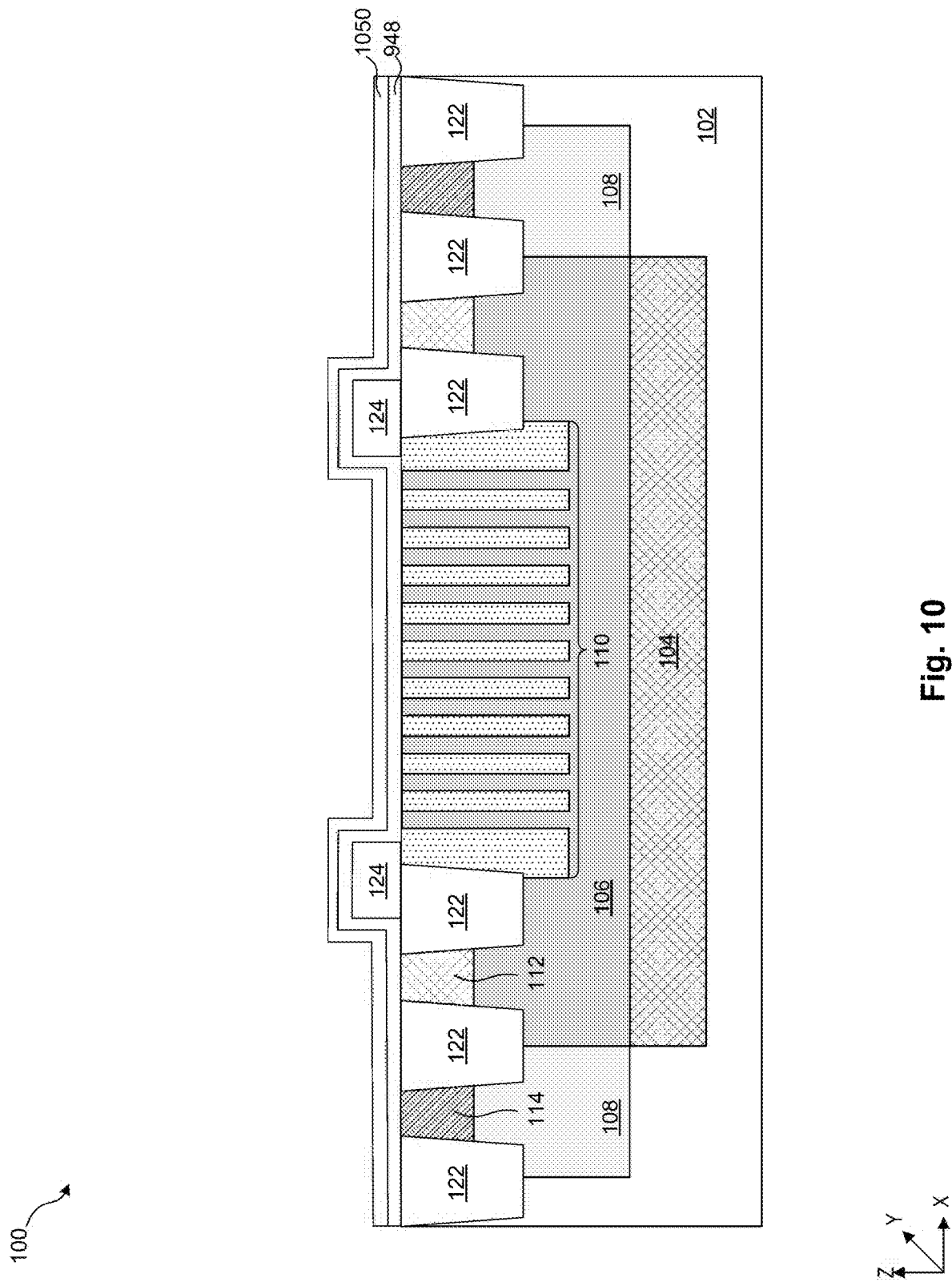
Figure 11:
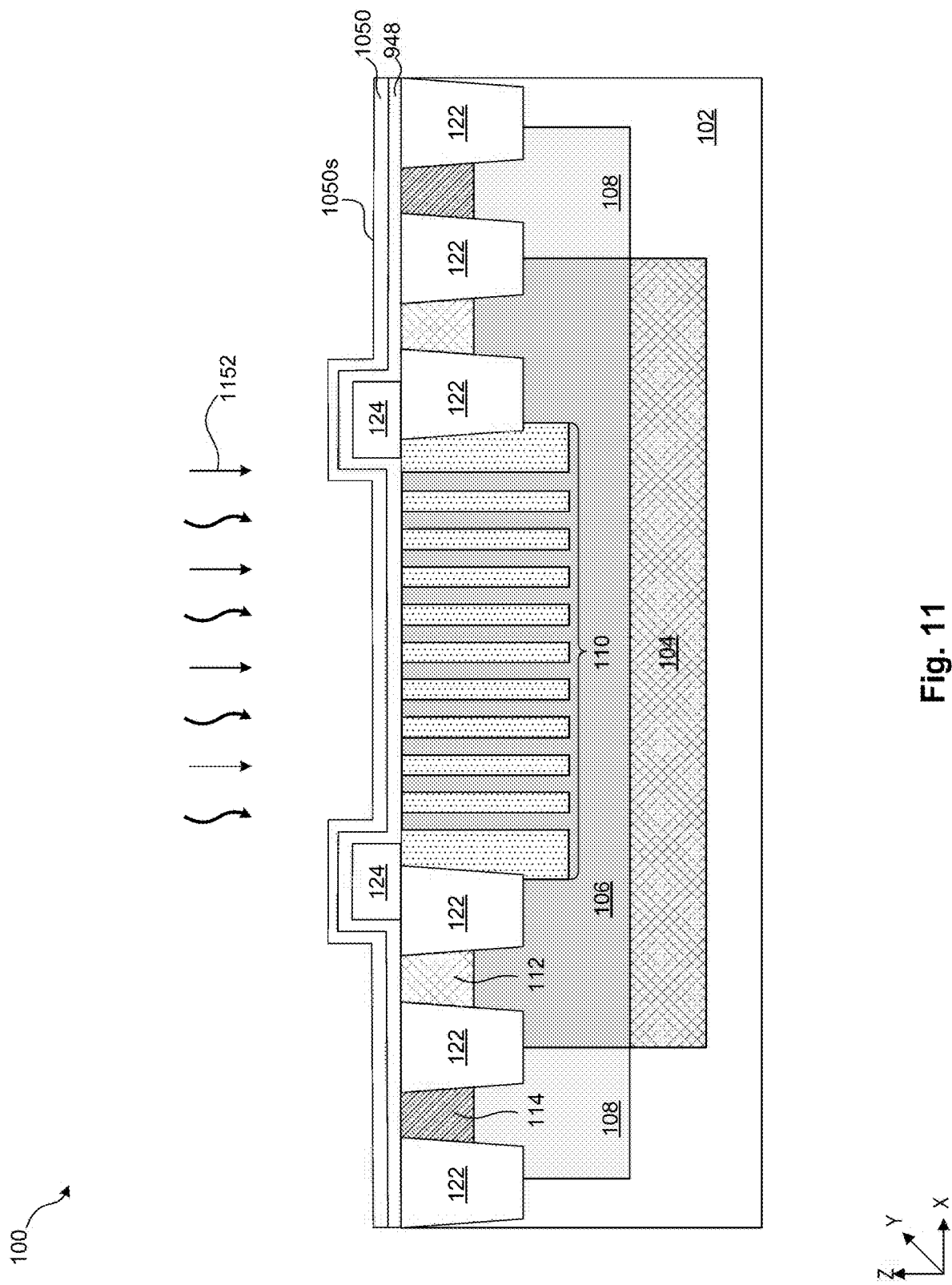
Figure 12:
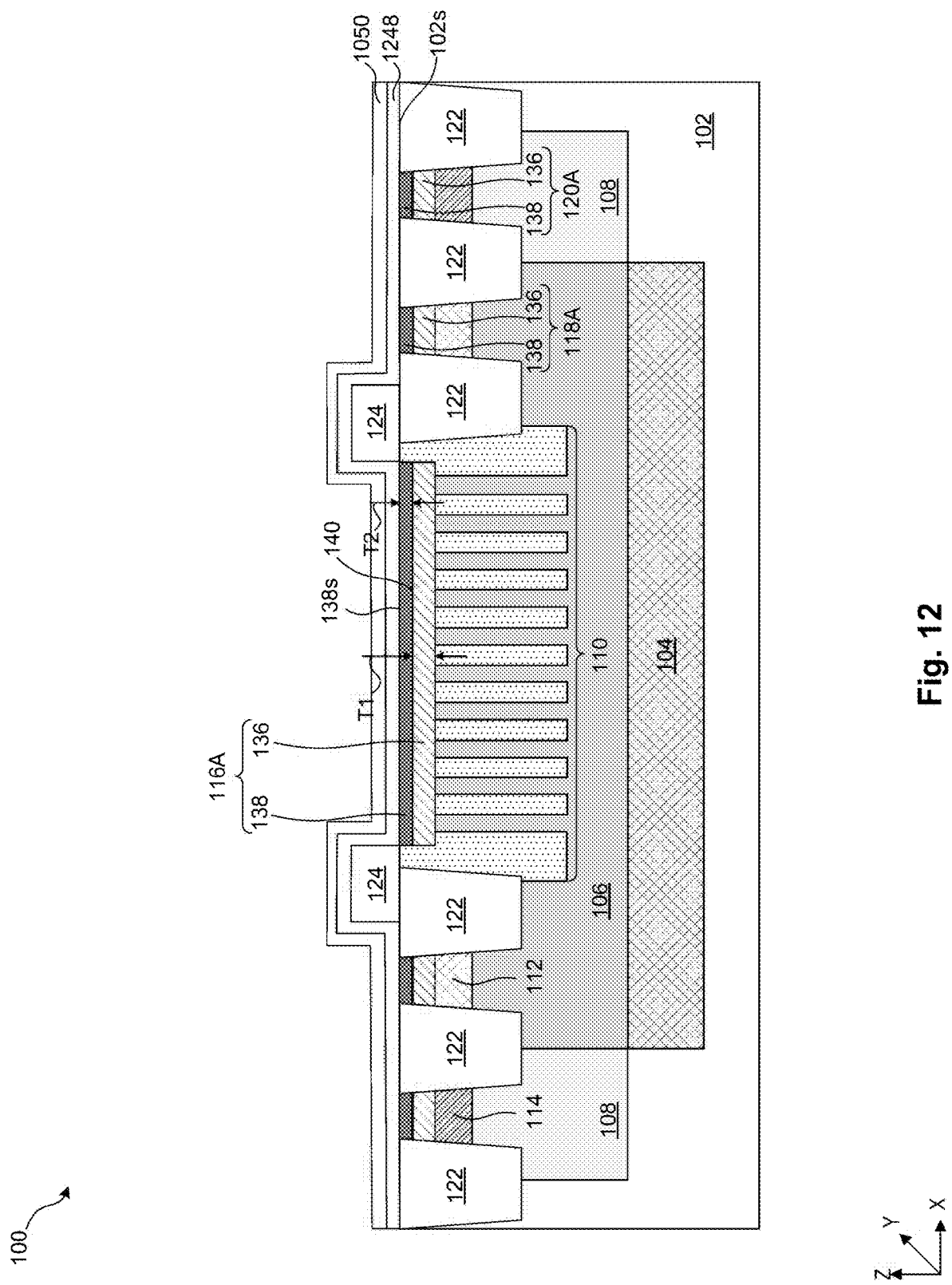
Figure 14:
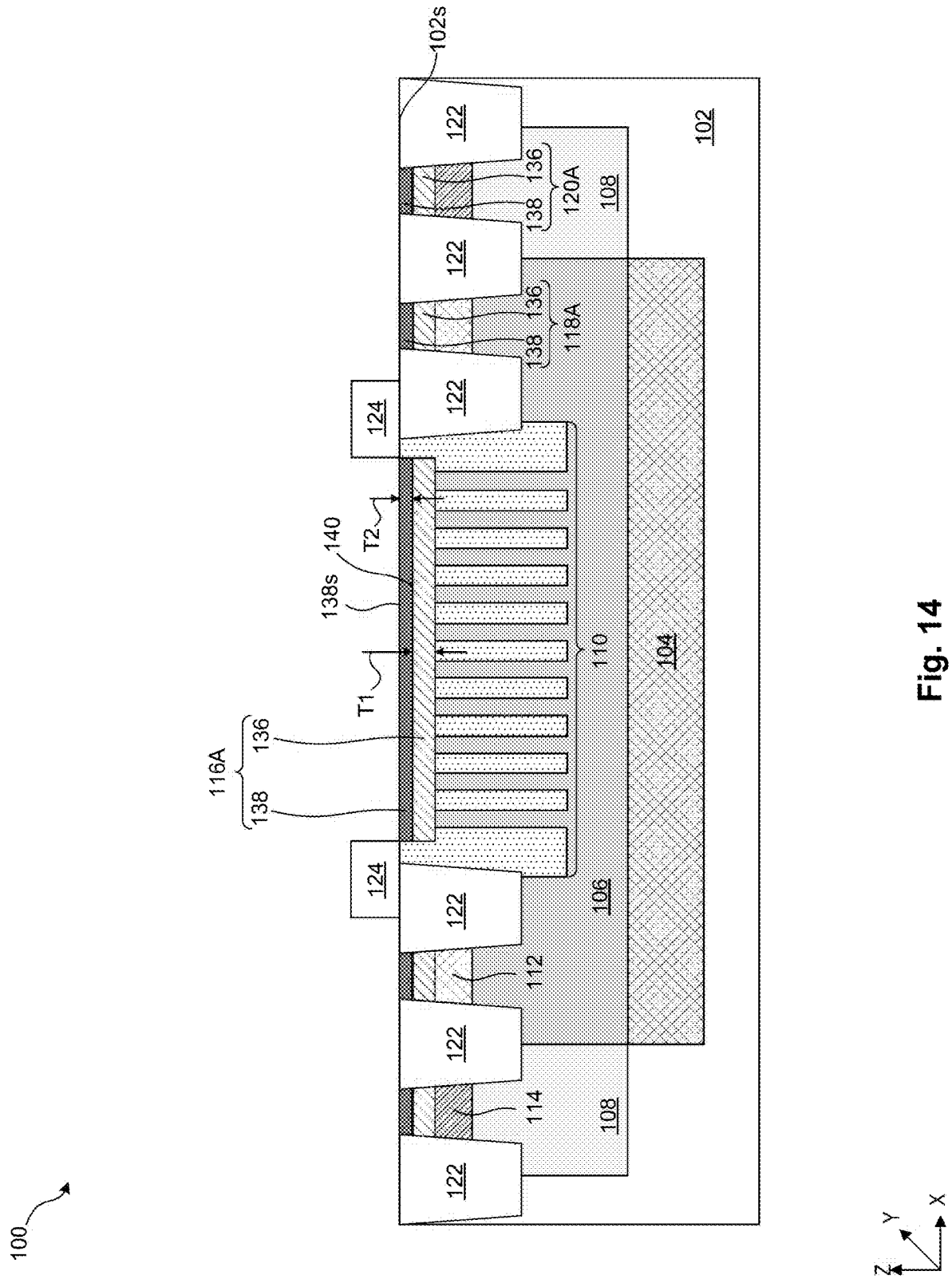

The formation of metallic layers 116A, 118A, and 120A can include sequential operations of (i) depositing a metal layer 948 on the structure of FIG. 8 to form the structure of FIG. 9, (ii) depositing a capping layer 1050 on the structure of FIG. 9 to form the structure of FIG. 10, (iii) simultaneously performing a thermal anneal process and a surface treatment process on the structure of FIG. 10, as shown in FIG. 11, to form the structure of FIG. 12, and (iv) removing capping layer 1050 and unreacted metal layer 1248 to form the structure of FIG. 14.

Figure 13:
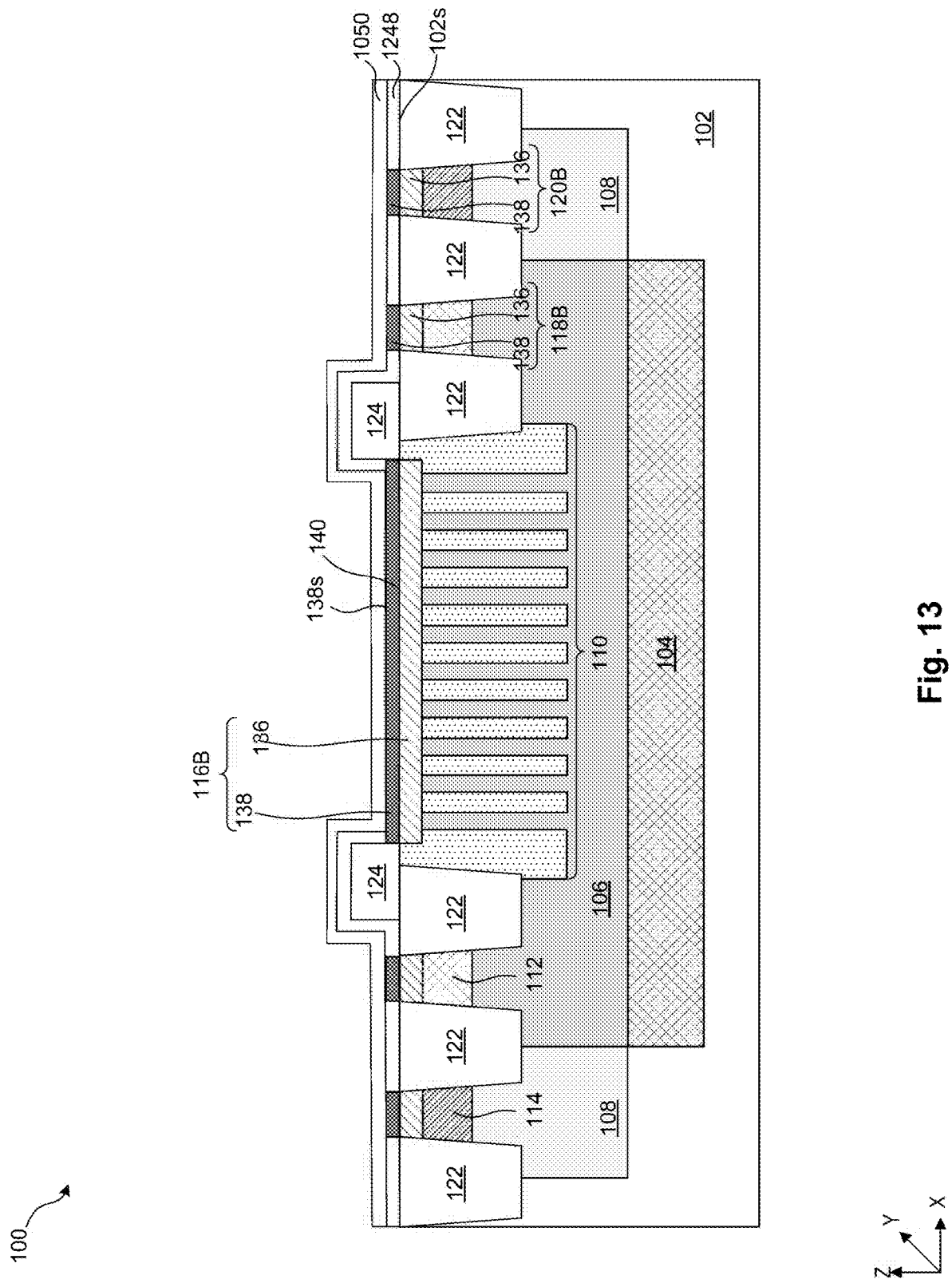
Figure 15:
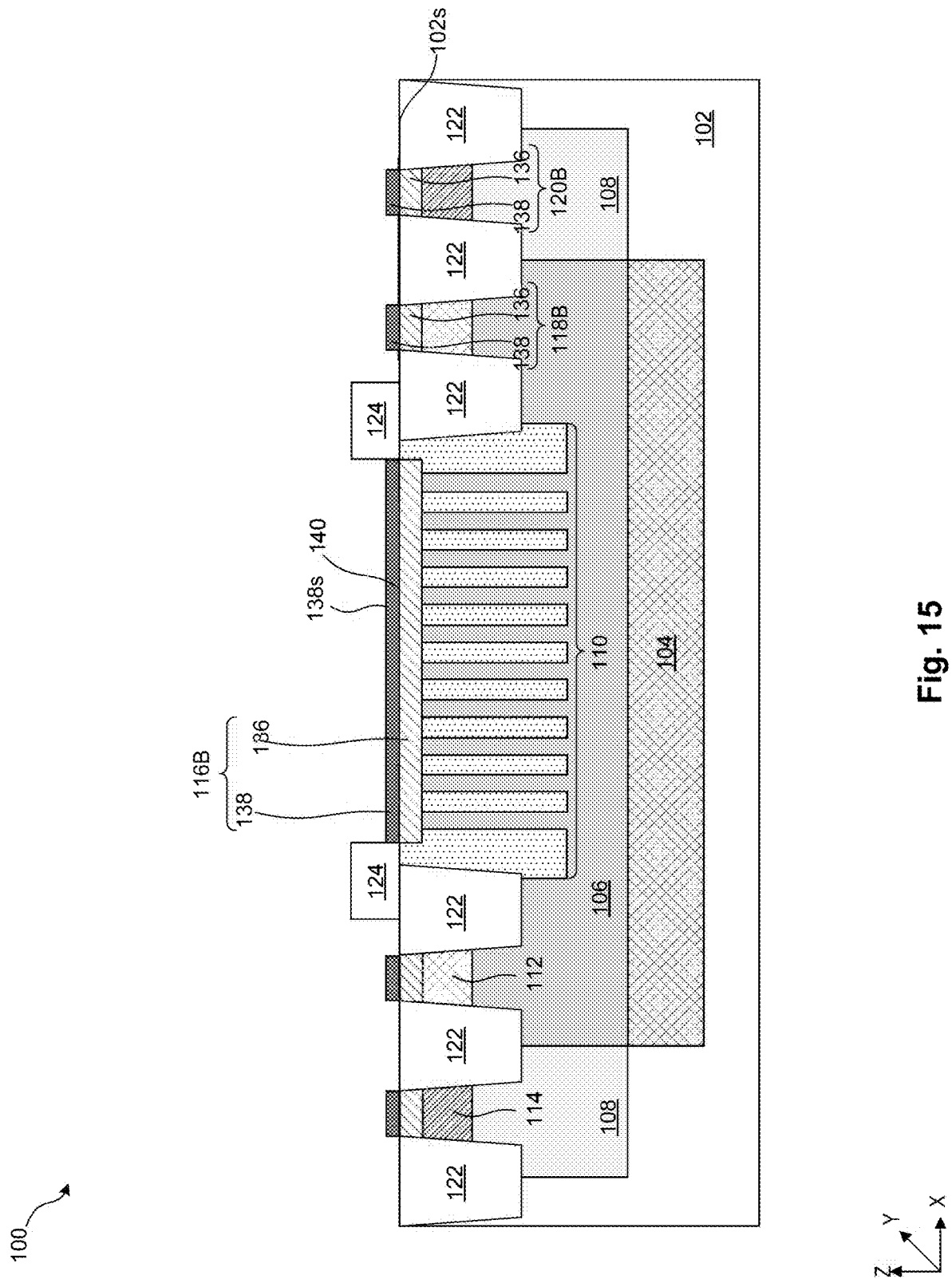
Figure 16:
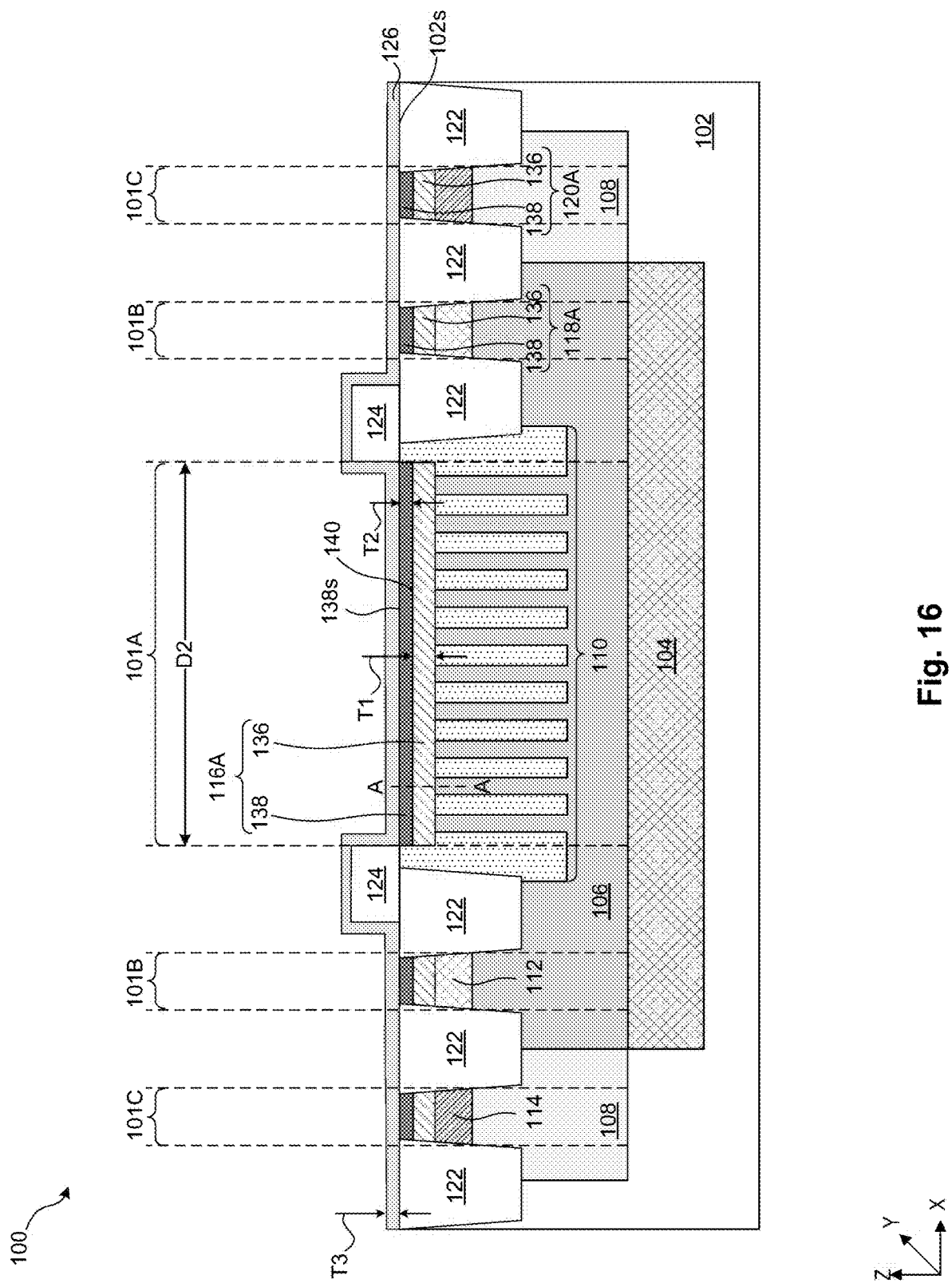
Figure 17:
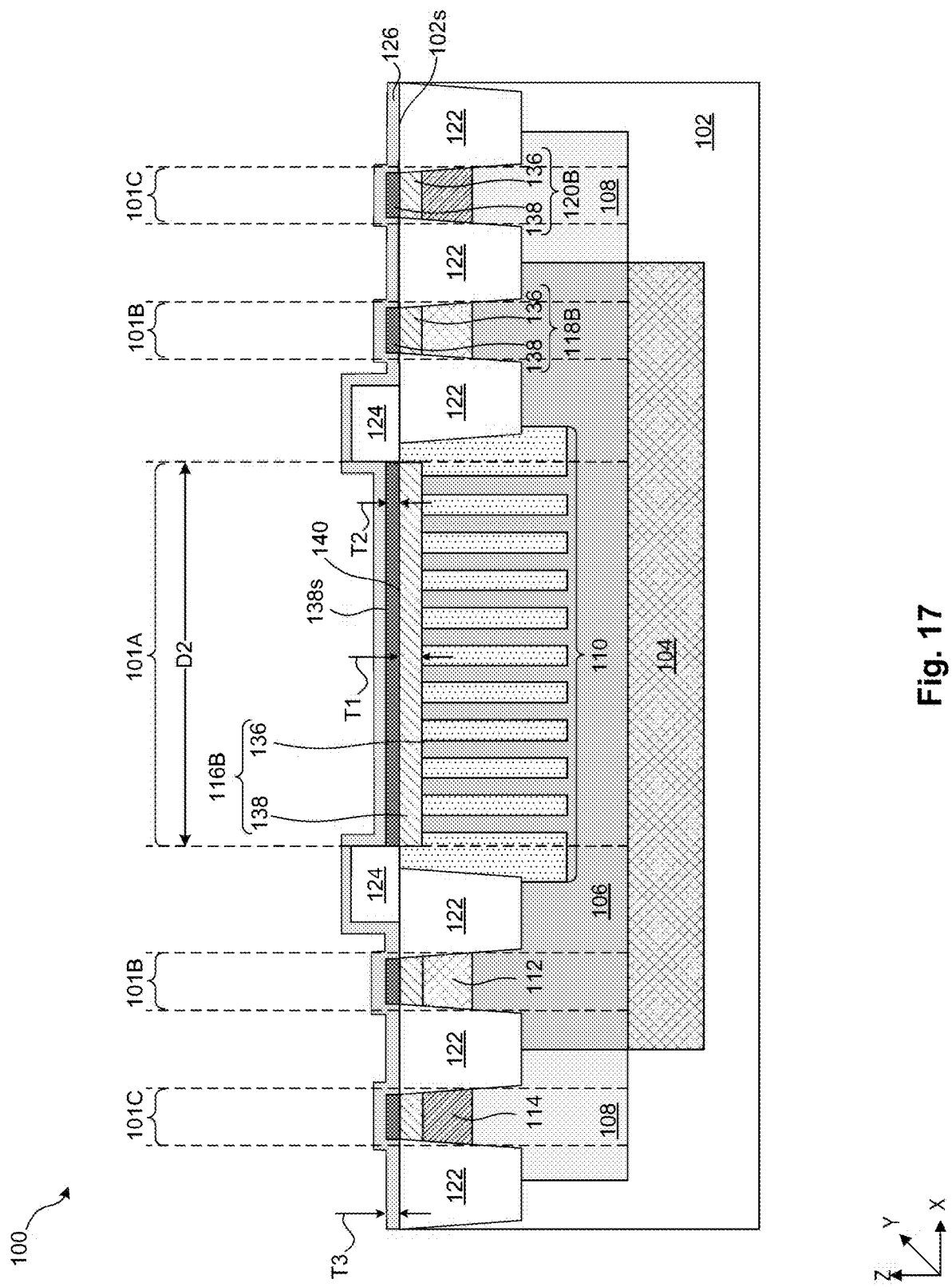

Similarly, the formation of metallic layers 116B, 118B, and 120B can include sequential operations of (i) depositing metal layer 948 on the structure of FIG. 8 to form the structure of FIG. 9, (ii) depositing capping layer 1050 on the structure of FIG. 9 to form the structure of FIG. 10, (iii) performing a thermal anneal process and a surface treatment process on the structure of FIG. 10, as shown in FIG. 11, to form the structure of FIG. 13, and (iv) removing capping layer 1050 and unreacted metal layer 1248 to form the structure of FIG. 15. Unreacted metal layer 1248 is a portion of metal layer 948 that did not convert into silicide.

In some embodiments, the thermal anneal process can include annealing the structure of FIG. 10 with a rapid thermal anneal process at a temperature of about 550° C. to about 850° C. The thermal anneal process can initiate a silicidation reaction between metal layer 948 and the semiconductor material (e.g., silicon) of second well region 106, third well regions 108, and fourth well region 110 to form metal silicide layers 136, as shown in FIG. 12 or FIG. 13. The top surfaces of metal silicide layers 136 may have dangling bonds, which can create surface traps, as explained above. The surface treatment process simultaneously performed with the thermal anneal process can repair the top surfaces of metal silicide layer 136 during the silicidation reaction.

In some embodiments, the surface treatment process can include flowing nitrogen-based gas 1152 during the thermal anneal process, as shown in FIG. 11. In some embodiments, nitrogen-based gas can include nitrogen gas, ammonia gas (NH3), nitrous oxide gas (N$_2$O), or other suitable nitrogen-based gas 1152. The nitrogen atoms can react with top portions of metal silicide layers 136 and form metal silicide nitride layers 138, as shown in FIG. 12 or FIG. 13. FIG. 12 illustrates the relative position of metal silicide layers 136 and metal silicide nitride layers 138 with respect to top surface 102s of substrate 102 when unreacted metal layer 1248 remains on metal silicide nitride layer 138. FIG. 13 illustrates the relative position of metal silicide layers 136 and metal silicide nitride layers 138 with respect to top surface 102s of substrate 102 when there is no unreacted metal layer 1248 on metal silicide nitride layers 138. The presence or absence of unreacted metal layer 1248 on metal silicide nitride layers 138 depends on the anneal temperature and duration.

Capping layer 1050 can prevent oxidation of metallic layers 116A and 116B during the thermal anneal process. In some embodiments, the deposition of capping layer 1050 can include depositing a layer of metal nitride, such as titanium nitride (TiN), tantalum nitride (TaN), and other suitable metal nitride materials. For the adequate diffusion of nitrogen atoms through capping layer 1050 during the surface treatment process, the metal nitride material of capping layer 1050 is formed with a cubic crystal structure, as shown in FIG. 20. As illustrated in FIG. 21, the cubic packing arrangement of the metal atoms and the nitrogen atoms of capping layer 1050 allows nitrogen gas to flow through capping layer 1050 during the surface treatment process. The (100), (200), or (220) crystal planes (not shown) of top surface 1050s of capping layer 1050 exposed to nitrogen gas flow 1152 facilitate the diffusion of nitrogen atoms through capping layer 1050. If capping layer 1050 is formed with other crystal structures, such as hexagonal closed packed (HCP) structure, the HCP packing arrangement of the metal atoms and nitrogen atoms can block the diffusion of nitrogen atoms during the surface treatment process.

In some embodiments, the formation of capping layer 1050 with cubic crystal structure can include forming a layer of metal nitride with a metal to nitrogen concentration ratio ranging from about 1:3 to about 1:4. If the metal to nitrogen concentration ratio is less than about 1:3, the metal nitride material may have an HCP crystal structure. In some embodiments, capping layer 1050 can be formed with a physical vapor deposition process using a gas mixture of argon and nitrogen-based gas, such as nitrogen gas, ammonia gas (NH3), nitrous oxide gas (N$_2$O), or other suitable nitrogen-based gas. In some embodiments, the ratio of nitrogen to argon in the gas mixture ranges from about 2 to about 4 to form the metal nitride material of capping layer 1050 with a cubic crystal structure and with a metal to nitrogen concentration ratio of about 1:3 to about 1:4. If the ratio of nitrogen to argon in the gas mixture is outside the range of about 2 to about 4, the concentration of metal may increase and the metal nitride material may have a non-cubic crystal structure, such as an HCP crystal structure.

Figure 18:
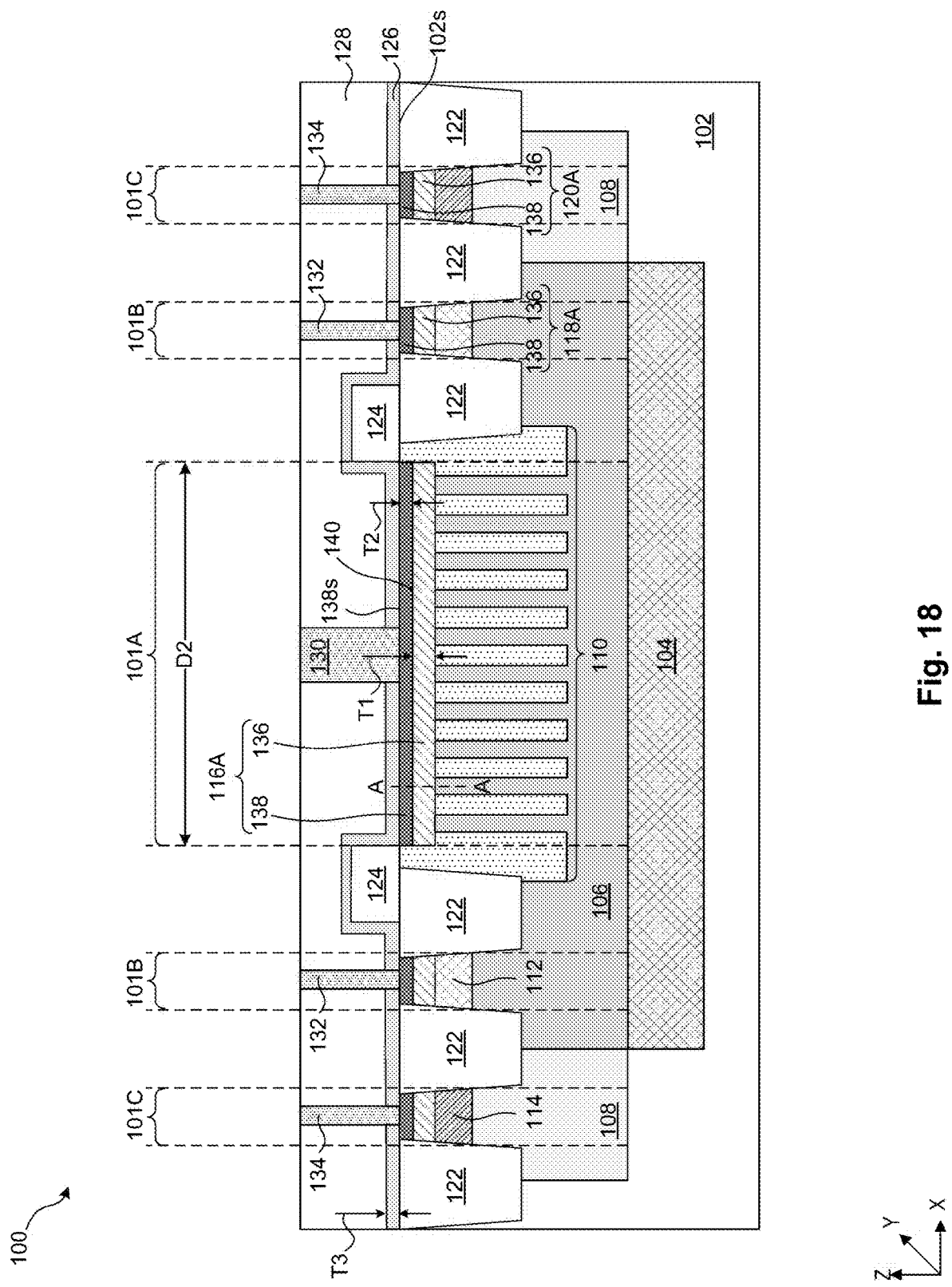

Referring to FIG. 2, in operation 225, contact structures are formed on the metallic layers. For example, as shown in FIGS. 18 and 19, contact structures 130, 132, and 134 can be formed on metal silicide nitride layers 138 through ESL 126 and ILD layer 128. Prior to the formation of contact structures 130, 132, and 134, ESL 126 can be formed on the structure of FIG. 14 or FIG. 15 to form the structure of FIG. 16 or FIG. 17, respectively. The formation of ESL 126 can be followed by the formation of ILD layer 128. The formation of contact structures 130, 132, and 134 can include sequential operations of (i) forming contact openings (not shown) within ILD layer 128 and ESL 126, (ii) depositing conductive material within the contact openings, and (iii) performing a CMP process on the conductive material to form the structure of FIG. 18 or FIG. 19.

The present disclosure provides example diodes (e.g., diode 100) and example methods (e.g., method 200) of forming the same. The diode can include a metallic layer (e.g., metallic layers 116A-116B) disposed on a semiconductor substrate. In some embodiments, the metallic layer can include a stack of metal silicide nitride layer (e.g., metal silicide nitride layer 138) and metal silicide layer (e.g., metal silicide layer 136).

In some embodiments, the metal silicide layer can be formed by a silicidation process between a metal layer (e.g., metal layer 948) and the semiconductor material of the substrate. In some embodiments, a top portion of the metal silicide layer can be converted to the metal silicide nitride layer during a surface treatment process of the metallic layer performed simultaneously with the silicidation process. The surface treatment process can include introducing nitrogen atoms to the metallic layer through a capping layer (e.g., capping layer 1050) disposed on the metallic layer. The capping layer can include a metal nitride material (e.g., TiN) and can prevent the oxidation of the metallic layer during the silicidation process.

In some embodiments, for the adequate diffusion of nitrogen atoms through the capping layer during the surface treatment process, the metal nitride material of the capping layer is formed with a cubic crystal structure. The cubic packing arrangement of the metal atoms and the nitrogen atoms of the capping layer allows nitrogen gas to flow through the capping layer during the surface treatment process. In some embodiments, the formation of the capping layer with the cubic crystal structure can include forming a layer of metal nitride with a metal to nitrogen concentration ratio ranging from about 1:3 to about 1:4. using a gas mixture of argon and nitrogen-based gas.

In some embodiments, the surface current leakage in the diode with the stack of metal silicide nitride layer and metal silicide layer can be reduced by about 10% to about 50% compared to diodes without the metal silicide nitride layers in the metallic layers.

In some embodiments, a semiconductor device includes a substrate, a first well region disposed within the substrate, a second well region disposed adjacent to the first well region and within the substrate, and an array of well regions disposed within the first well region. The first well region includes a first type of dopants, the second well region includes a second type of dopants that is different from the first type of dopants, and the array of well regions include the second type of dopants. The semiconductor device further includes a metal silicide layer disposed on the array of well regions and within the substrate, a metal silicide nitride layer disposed on the metal silicide layer and within the substrate, and a contact structure disposed on the metal silicide nitride layer.

In some embodiments, a semiconductor device includes a substrate, a first well region disposed within the substrate, a second well region disposed adjacent to the first well region and within the substrate, and an array of well regions disposed within the first well region, The semiconductor device further includes a silicide layer disposed on the array of well regions and within the substrate, a silicide nitride layer disposed on the substrate, and a contact structure disposed on the silicide nitride layer.

In some embodiments, a method includes forming a first well region with a first type of dopants within a substrate and forming an array of well regions with a second type of dopants within the first well region. The second type of dopants is different from the first type of dopants. The method further includes forming a metal silicide layer on the array of well regions and within the substrate, forming a metal silicide nitride layer on the metal silicide layer and within the substrate, and forming a contact structure on the metal silicide nitride layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out forming a contact structure on the metal silicide nitride layer the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first well region with a first type of dopants in a substrate;
   forming an array of well regions with a second type of dopants in the first well region;
   forming a metal silicide layer on the array of well regions and in the substrate;
   forming a metal silicide nitride layer on the metal silicide layer and in the substrate, wherein an interface between the metal silicide layer and the metal silicide nitride layer is at a plane same as or lower than a top surface of the substrate; and
   forming a conductive structure in the metal silicide nitride layer.

2. The method of claim 1, wherein forming the metal silicide layer comprises depositing a metal layer on the array of well regions.

3. The method of claim 1, wherein forming the metal silicide layer comprises depositing a capping layer on the array of well regions.

4. The method of claim 1, wherein forming the metal silicide layer comprises depositing a metal nitride layer with a cubic crystal structure.

5. The method of claim 1, wherein forming the metal silicide layer comprises performing an anneal process and a surface treatment process at a same time.

6. The method of claim 1, wherein forming the metal silicide layer comprises:
   depositing a metal layer on the array of well regions; and
   performing a nitrogen-based surface treatment on the metal layer.

7. The method of claim 1, wherein forming the metal silicide layer comprises:
   depositing a metal nitride layer on the array of well regions; and
   exposing the metal nitride layer to a nitrogen-based gas.

8. The method of claim 1, wherein forming the metal silicide nitride layer comprises depositing, on the array of well regions, a metal nitride layer with a metal to nitrogen concentration ratio of about 1:3 to about 1:4.

9. The method of claim 1, further comprising forming a doped region with a third type of dopants in the first well region.

10. The method of claim 9, further comprising:
    forming an other metal silicide layer on the doped region; and
    forming an other metal silicide nitride layer on the other metal silicide layer.

11. A method, comprising:
    forming an array of well regions in a substrate;
    depositing a metal layer on the array of well regions;
    depositing an oxygen barrier layer on a top surface of the metal layer;
    performing, on the oxygen barrier layer, an anneal process and a surface treatment process to form a metal silicide layer on the array of well regions; and
    forming a conductive structure on the metal silicide layer.

12. The method of claim 11, wherein the anneal process and the surface treatment process are performed at a same time.

13. The method of claim 11, wherein performing the surface treatment comprises exposing the oxygen barrier layer to a nitrogen-based gas.

14. The method of claim 11, wherein depositing the oxygen barrier layer comprises depositing a metal nitride layer with a cubic crystal structure.

15. The method of claim 11, wherein depositing the oxygen barrier layer comprises depositing a metal nitride layer with a metal to nitrogen concentration ratio of about 1:3 to about 1:4.

16. The method of claim 11, further comprising:
forming a doped region in the substrate;
forming an other metal silicide layer on the doped region; and
forming a metal silicide nitride layer on the other metal silicide layer.

17. A method, comprising:
forming first and second well regions in a substrate;
forming a metal silicide layer extending from the first well region to the second well region;
forming a metal silicide nitride layer on the metal silicide layer, wherein an interface between the metal silicide layer and the metal silicide nitride layer is at a plane same as or lower than a top surface of the substrate; and
forming a conductive structure on the metal silicide layer.

18. The method of claim 17, wherein forming the metal silicide layer comprises:
depositing a metal layer on the first and second well regions; and
depositing a metal nitride layer on the metal layer.

19. The method of claim 18, wherein forming the metal silicide layer further comprises:
performing a rapid thermal anneal process on the metal nitride layer; and
exposing the metal nitride layer to a nitrogen-based gas.

20. The method of claim 18, wherein depositing the metal nitride layer comprises depositing the metal nitride layer with a metal to nitrogen concentration ratio of about 1:3 to about 1:4.

* * * * *